(12) United States Patent
Miyamoto

(10) Patent No.: US 6,531,768 B2
(45) Date of Patent: Mar. 11, 2003

(54) SEMICONDUCTOR INTEGRATED CIRCUIT DEVICE WITH OPTICAL WAVE GUIDES

(75) Inventor: Toshio Miyamoto, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/951,981

(22) Filed: Sep. 14, 2001

(65) Prior Publication Data

US 2002/0013043 A1 Jan. 31, 2002

Related U.S. Application Data

(63) Continuation of application No. 09/805,056, filed on Mar. 14, 2001.

(30) Foreign Application Priority Data

Mar. 14, 2000 (JP) ........................................ 2000-070319
Jan. 12, 2001 (JP) ........................................ 2001-004838

(51) Int. Cl.[7] ............................................. H01L 23/24
(52) U.S. Cl. ..................................................... 257/687
(58) Field of Search ................ 29/840, 843; 228/180.5, 228/199; 257/678, 680, 689, 685–687, 688, 690, 692, 693, 696, 697, 698, 700, 701, 702, 707, 717, 718, 723, 734, 735, 737, 738, 773–775, 778, 784, 787, 788, 791; 427/117; 438/14, 106, 107, 108, 110, 111, 112, 122, 124, 611, 617

(56) References Cited

U.S. PATENT DOCUMENTS

| | | | | |
|---|---|---|---|---|
| 4,699,449 A | * | 10/1987 | Lam et al. | 385/14 |
| 5,049,978 A | * | 9/1991 | Bates et al. | 257/686 |
| 5,119,451 A | * | 6/1992 | Wills et al. | 385/14 |
| 5,159,700 A | * | 10/1992 | Reid et al. | 385/14 |
| 5,476,211 A | | 12/1995 | Khandros | 228/180.5 |
| 6,014,313 A | * | 1/2000 | Hesselbom | 361/704 |
| 6,274,391 B1 | * | 7/2001 | Wachtler et al. | 438/6 |
| 6,301,401 B1 | * | 10/2001 | La | 385/14 |

FOREIGN PATENT DOCUMENTS

| | | |
|---|---|---|
| JP | 8293509 | 11/1996 |
| JP | 8340002 | 12/1996 |

* cited by examiner

*Primary Examiner*—Kamand Cuneo
*Assistant Examiner*—Asok Kumar Sarkar
(74) *Attorney, Agent, or Firm*—Antonelli, Terry, Stout & Kraus, LLP

(57) ABSTRACT

A laser beam is irradiated onto a photocurable resin layer formed on an electrode part before rearrangement. By scanning the resin on the periphery of a metal wiring formation area extending from the electrode part before rearrangement to a bump electrode contact area, is cured. As a result, a cured resin part is formed which works as a guide layer and a protection film for protecting the metal wire in which the metal wiring formation area has a hollow shape. Thereafter, the metal wire is formed inside the cured resin part.

4 Claims, 19 Drawing Sheets

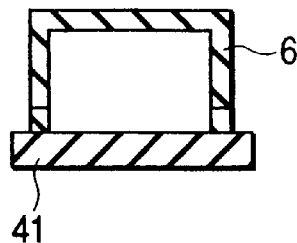
FIG. 38(a)
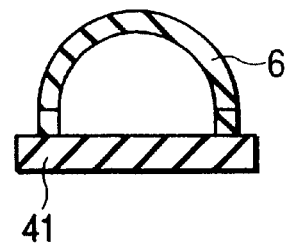
FIG. 38(b)
FIG. 39(a)
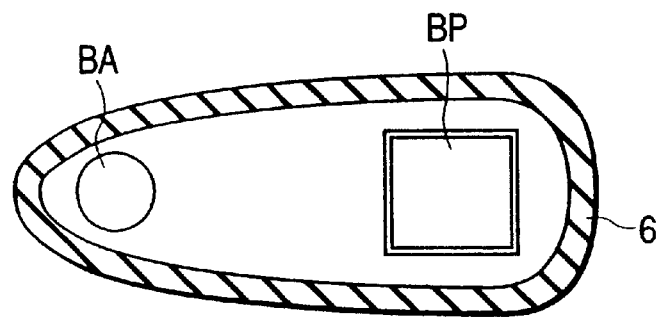
FIG. 39(b)
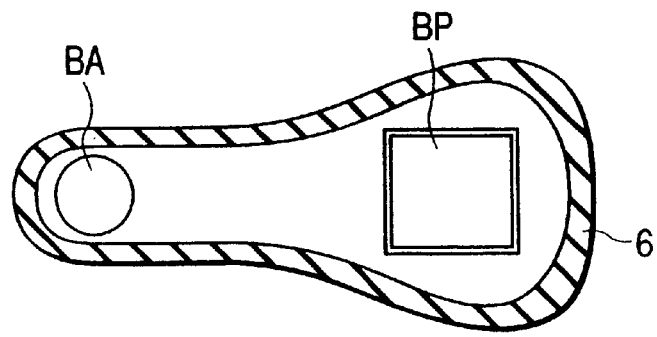
FIG. 39(c)
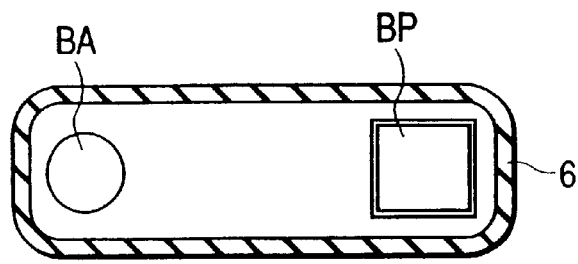

SEMICONDUCTOR INTEGRATED CIRCUIT DEVICE WITH OPTICAL WAVE GUIDES

This is a continuation of application Ser. No. 09/805,056, filed Mar. 14, 2001.

BACKGROUND OF THE INVENTION

The present invention relates to a technique for manufacturing a semiconductor integrated circuit device. The invention particularly relates to a technique effective for application to a CSP (chip size package) that is electrically connected via a metal wire between a bump electrode disposed on a chip and an electrode part before rearrangement.

Along with reduction in electric and electronic apparatuses in size, the reduction of semiconductor integrated circuit devices used in the apparatuses for them have also been progressed in both size and thickness. The CSP means a general name of a package having a size equivalent to or slightly larger than the size of a semiconductor chip, and this CSP has been practically used as a package capable of realizing the reduction in sizes and thickness.

A metal wire is used to connect this CSP, a gap between an electrode part before rearrangement (for example, a part called a bonding pad), being a part of top-layer wires arranged in a semiconductor chip and a bump electrode being an external connection terminal.

There are following methods for performing the above-mentioned connection, for example. A passivation film and a polyimide film on the top-layer wires are selectively removed by etching, and thereby exposing the electrode part before rearrangement. Thereafter, a copper (Cu) film is deposited by a sputtering method on the passivation film and the electrode part before rearrangement to perform a pattering. By this method, a copper wire is formed to extend from the electrode part before rearrangement to a bump electrode formation area. A method like this is disclosed in, for example, Japanese Patent Laid-open No. 8-340002.

There is also a method of forming a wire-shaped projection extending from the electrode part before rearrangement to the bump electrode formation area by a bonding machine. Such a method is disclosed in, for example, U.S. Pat. No. 5,476,211.

Meanwhile, as a technique for encapsulating a semiconductor chip, there has been investigated a technique of forming an encapsulation layer by using photocurable components for curing the resin with optical energy. According to this technique, after forming an encapsulation layer using the photocurable components, a solder paste is charged therein. Then, a solder bump is formed on this paste. This technique is disclosed in, for example, Japanese Patent Laid-open No. 8-293509.

However, in the above-described methods, it is difficult to develop materials as sputtering durability is required in forming copper wires on a polyimide film that is used as a stress relaxation layer. Further, it is difficult to reduce cost of manufacturing the copper wires as the manufacture includes many processes.

On the other hand, in the case of forming the wire-shaped projection by using the bonding machine, there is a limit to respective pitches between terminals because the terminals are formed mechanically. Further, a short circuit occurs easily between the terminals as the terminals are exposed outside.

Further, in the above method using the photocurable components, both metal wiring part (solder paste part) and encapsulation layer seem to have insufficient stress relaxing force.

SUMMARY OF THE INVENTION

An object of the present invention is to provide a method of manufacturing a semiconductor integrated circuit device having a stress relaxing force and being capable of forming both a metal wiring part and a guide layer in a relatively simple process and in high precision by utilizing a photocurable resin. The guide layer also works as a protection film for protecting a metal wire.

The above object and new features of the present invention will become apparent from description of the present specification and the appended drawings.

Among the aspects disclosed in the present invention, some representative aspects are briefly explained as follows.

(1) According to a method of manufacturing a semiconductor integrated circuit device of the present invention, a photocurable resin layer is formed on an insulation film and an electrode part before rearrangement on a semiconductor substrate. A laser beam is irradiated onto a periphery of a metal wiring formation scheduled area that extends from the electrode part before rearrangement to a bump electrode contact area. By scanning, the photocurable resin is cured, and a guide layer is formed. Then, a metal wire is formed by plating in a hollow-shaped part along this guide layer.

(2) A metal wire may be formed by forming a metal seed layer for electroplating on the electrode part before rearrangement and by performing electroplating.

(3) An aperture larger than the bump electrode contact area may be formed in the guide layer.

(4) And an induction hole may be formed in a part of a lower area of the guide layer.

(5) Further, according to a method of manufacturing a semiconductor integrated circuit device of the present invention, a photocurable resin layer is formed on an insulation film and an electrode part before rearrangement on a semiconductor substrate. A laser beam is irradiated onto metal wiring formation scheduled area that extends from the electrode part before rearrangement to a bump electrode contact area. By scanning, the photocurable resin is cured. Then, a surface of this cured resin is plated, thereby forming a metal wire.

(6) Further, according to a method of manufacturing a semiconductor integrated circuit device of the present invention, a photocurable resin layer is formed on a packaging substrate on which a chip having a semiconductor integrated circuit is mounted. Then, a laser beam is irradiated onto this layer, and by scanning, an optical waveguide, a signal path like a high-frequency transmission path, or a passage for a liquid substance is formed.

(7) A semiconductor integrated circuit device of the present invention has a metal wire that extends from an electrode part before rearrangement to a bump electrode contact area, and a protection layer that is formed around the metal wire by curing a photocurable resin.

(8) A semiconductor integrated circuit device of the present invention has a cured resin part that extends from an electrode part before rearrangement to a bump electrode contact area and that is formed by curing a photocurable resin, and a metal wiring part formed around the cured resin part.

(9) A semiconductor integrated circuit device of the present invention has a packaging substrate on which a chip having a semiconductor integrated circuit is mounted, and an optical waveguide, a signal path like a high-frequency transmission path, or a passage for a liquid substance made of a cured resin part that is formed by curing a photocurable resin.

According to the above means, a photocurable resin is utilized, and the resin near the metal wiring formation area that extends from the electrode part before rearrangement to the bump electrode is cured, thereby forming a metal wiring guide layer and a protection film. The metal wire is formed, thereafter. Therefore, it is possible to form this metal wiring part and the metal wiring guide layer that also works as a protection film, in a relatively simple process and with high precision.

Further, as the metal wire covered by the guide layer and protection film, it is possible to relax the external stress to the metal wire.

BRIEF DESCRIPTION OF THE DRAWINGS

FIG. 38(a) is a cross-sectional view of a cured resin part taken along a line A–A' in FIG. 28.

FIG. 38(b) is a cross-sectional view of a cured resin part taken along a line A–A' in FIG. 28.

FIG. 39(a) is a cross-sectional view of a cured resin part taken along a line B–B' in FIG. 28 respectively.

FIG. 39(b) is a cross-sectional view of a cured resin part taken along a line B–B' in FIG. 28 respectively.

FIG. 39(c) is a cross-sectional view of a cured resin part taken along a line B–B' in FIG. 28 respectively.

DESCRIPTION OF THE PREFERRED EMBODIMENTS

Embodiments of the present invention will be explained in detail below with reference to the drawings. In explaining the embodiments, components having the same function will be denoted by the same reference numbers or symbols, and repetitive explanation of the components will be omitted.

Embodiment 1

A method of manufacturing a semiconductor integrated circuit device, which is embodiment 1 of the present invention, will be explained with reference to FIG. 1 to FIG. 6 in sequence.

Figure 1:
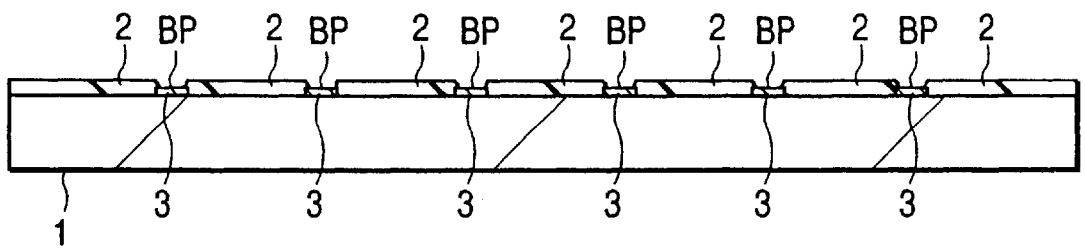
FIG. 1 is a cross-sectional view of a key part of a substrate showing a method of manufacturing a semiconductor integrated circuit device relating to embodiment 1 of the present invention.
Figure 47:
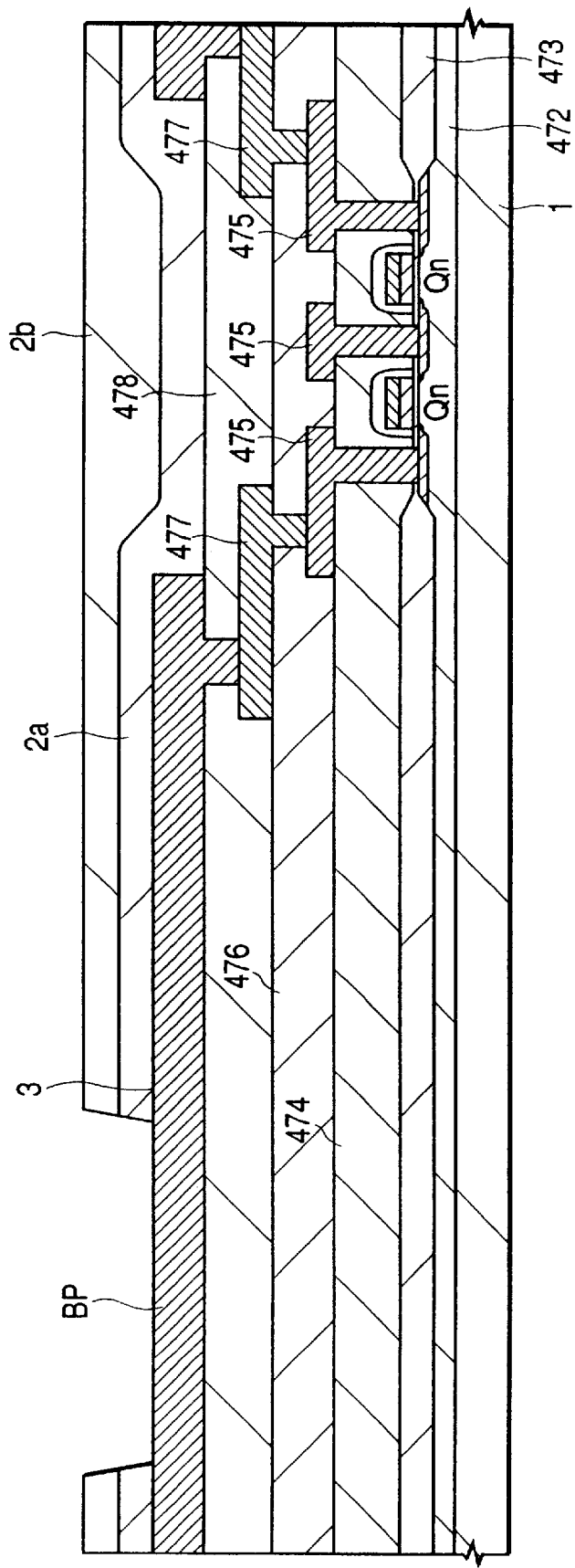
FIG. 47 is a cross-sectional view of a key part of a substrate showing a pre-processing of a method of manufacturing a semiconductor integrated circuit device relating to the embodiments of the invention.

As shown in FIG. 1, a protection layer 2 (an insulation film) consisting of a passivation film and a polyimide resin or the like is formed on a semiconductor substrate (hereinafter to be simply referred to as a substrate) 1. This protection layer 2 is formed on top-layer wires 3 that is formed on the substrate 1. Parts of the protection layer 2 are removed so as to expose respective parts of these top-layer wires as electrode parts before rearrangement BP. While not shown in FIG. 1, elements (semiconductor elements) of such a MISFET (Metal Insulator Semiconductor Field Effect Transistors) or the like as to constitute a memory, a microcomputer, or the like are formed on the substrate 1, and are connected to the top-layer wires via a plurality of wiring layers. FIG. 47 shows one example of this arrangement. As shown in FIG. 47, by means of a normal MOS device process, MISFETQns are formed on an active area of the substrate 1 on which a diffusion area 472 is formed, that is, on an area on which a field oxide film 473 is not formed. A silicon oxide film 474 is formed on this MISFETQn. Then, parts of the silicon oxide film 474 on source and drain areas of the MISFETQn are removed, thereby forming contact holes therein. Further, an Al (aluminum) film 475 is deposited in the contact holes and on the silicon oxide film 474 by a sputtering method. Thereafter, a patterning is carried out on the Al film 475 by dry etching. Similarly, a silicon oxide film 476 is formed on the Al film 475 and the silicon oxide film 474. Thereafter, contact holes are formed in the silicon oxide film 476 to provide Al wires 477. Further, a silicon oxide film 478 is formed on the Al wires 477 and the silicon oxide film 476, and thereafter, contact holes are formed in the silicon oxide film 478 to provide Al wires 3 (the top-layer wires). As explained above, it is possible to obtain a multi-wiring structure by alternately forming a silicon oxide film and Al wires thereon. On the top-layer wires 3, an inorganic passivation film 2a and an organic passivation film 2b (the protection film 2) like a polyimide resin layer thereon are formed. By selectively removing these films, respective parts of the top-layer wires 3 are exposed as the electrode parts before rearrangement BP, as explained above.

Figure 2:
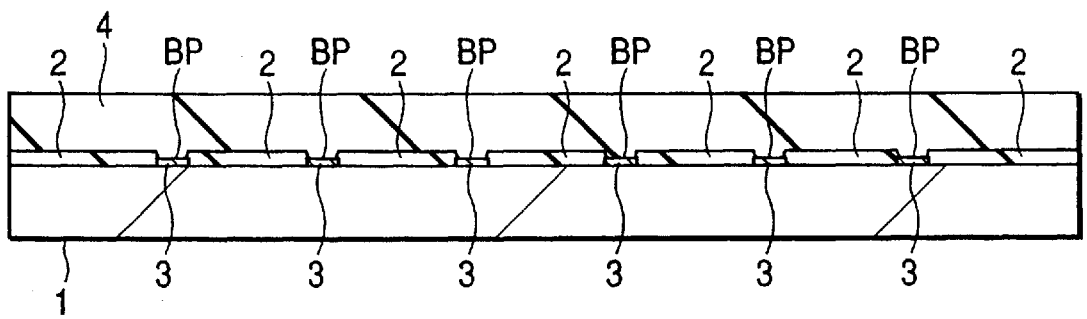
FIG. 2 is a cross-sectional view of a key part of a substrate showing a method of manufacturing a semiconductor integrated circuit device relating to the embodiment 1 of the invention.

Next, as shown in FIG. 2, a photocurable resin is coated on the protection layer 2 and the electrode part before rearrangement BP, thereby forming a photocurable resin layer 4 thereon. For forming this photocurable resin layer 4, there are used a method of adhering a photocurable resin formed in a tape shape onto the substrate or a method of screen printing. It is also possible to use a method of accommodating a liquid photocurable resin in a vessel and fixing the substrate in a vessel. For the photocurable resin, it is possible to use urethane acrylate, photosensitive polyimide, silicon resin, fluorine-contained resin, etc.

Figure 3:
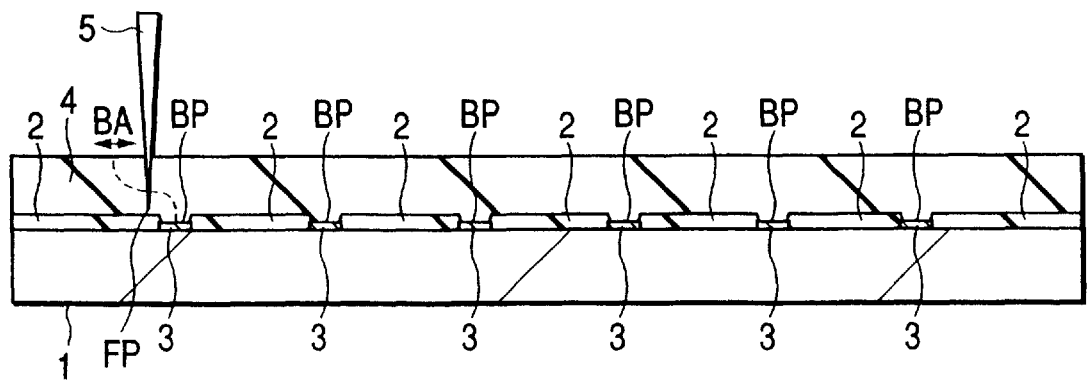
FIG. 3 is a cross-sectional view of a key part of a substrate showing a method of manufacturing a semiconductor integrated circuit device relating to the embodiment 1 of the invention.

Next, as shown in FIG. 3, a laser beam 5 is irradiated into the photocurable resin layer 4, thereby bringing about curing reaction of the photocurable resin layer 4 at a light-focusing part FP of this beam. The photocurable resin layer 4 at the peripheral portion of a metal wiring formation area (a broken-line part shown in FIG. 3) described later is cured by scanning the light-focusing part FP in the peripheral portion of this metal wiring formation area from the respective electrodes part before rearrangement BP to respective bump electrode contact areas BA. There are various methods for this scanning, including a method of scanning along a spiral line on the peripheral portion of the metal wiring formation area. For the laser beam, there can be used an excimer laser, an electron beam, X-rays, and ultraviolet rays.

Figure 4:
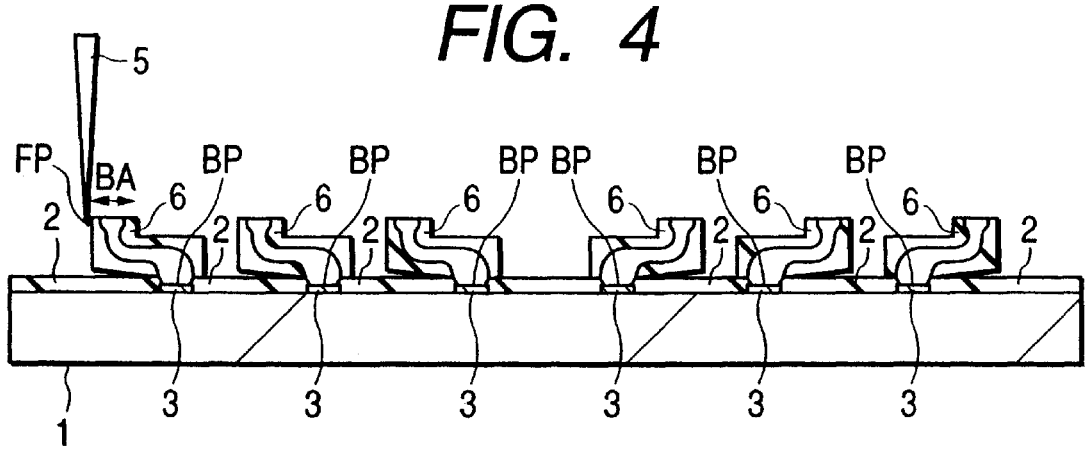
FIG. 4 is a cross-sectional view of a key part of a substrate showing a method of manufacturing a semiconductor integrated circuit device relating to the embodiment 1 of the invention.

Next, uncured portions of the photocurable resin layer 4 are removed. As a result, cylindrical cured resin parts 6 (guide layers) having the metal wiring formation area formed in a hollow shape, respectively, are provided, as shown in FIG. 4. These cured resin parts 6 become the guide layers for protecting metal wires when the metal wires described later are formed. After forming the metal wires, these cured resin parts 6 become the protection layers for relaxing the stress applied to the metal wires.

Figure 5:
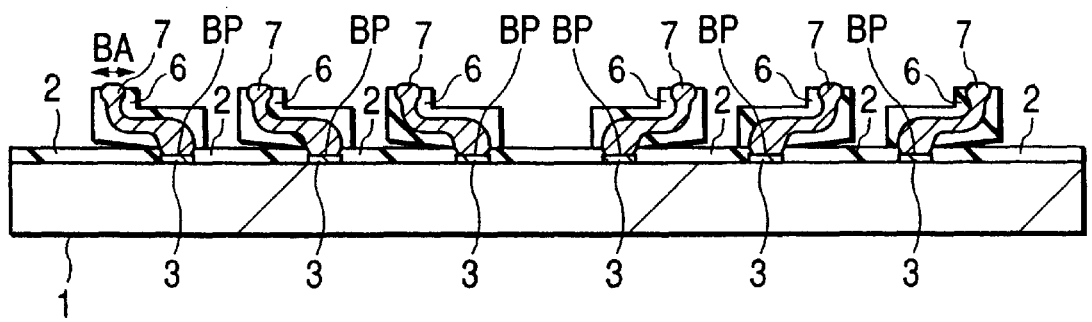
FIG. 5 is a cross-sectional view of a key part of a substrate showing a method of manufacturing a semiconductor integrated circuit device relating to the embodiment 1 of the invention.

Next, the substrate 1 is dipped into a copper nonelectrode plating liquid, and copper is grown inside each of the cured resin parts 6, thereby forming a copper wire 7 (the metal wire) having a diameter of 3 to 10 $\mu$m and extending from each of the electrode parts before rearrangement BP to each of the bump electrode contact areas BA, as shown in FIG. 5.

Figure 6:
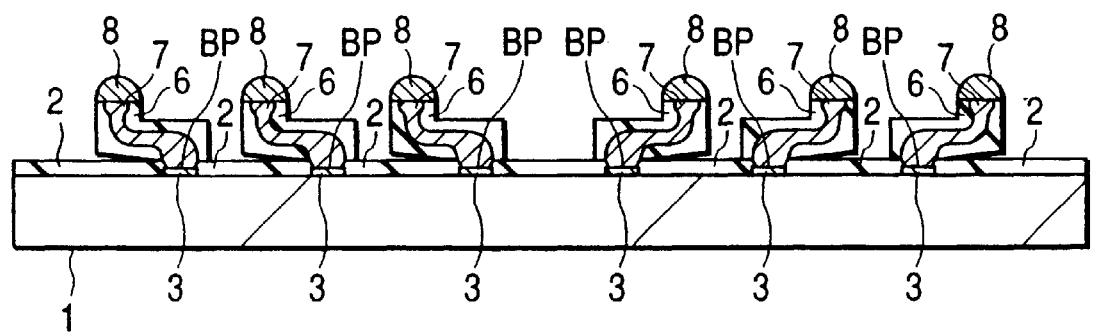
FIG. 6 is a cross-sectional view of a key part of a substrate showing a method of manufacturing a semiconductor integrated circuit device relating to the embodiment 1 of the invention.
Figure 48:
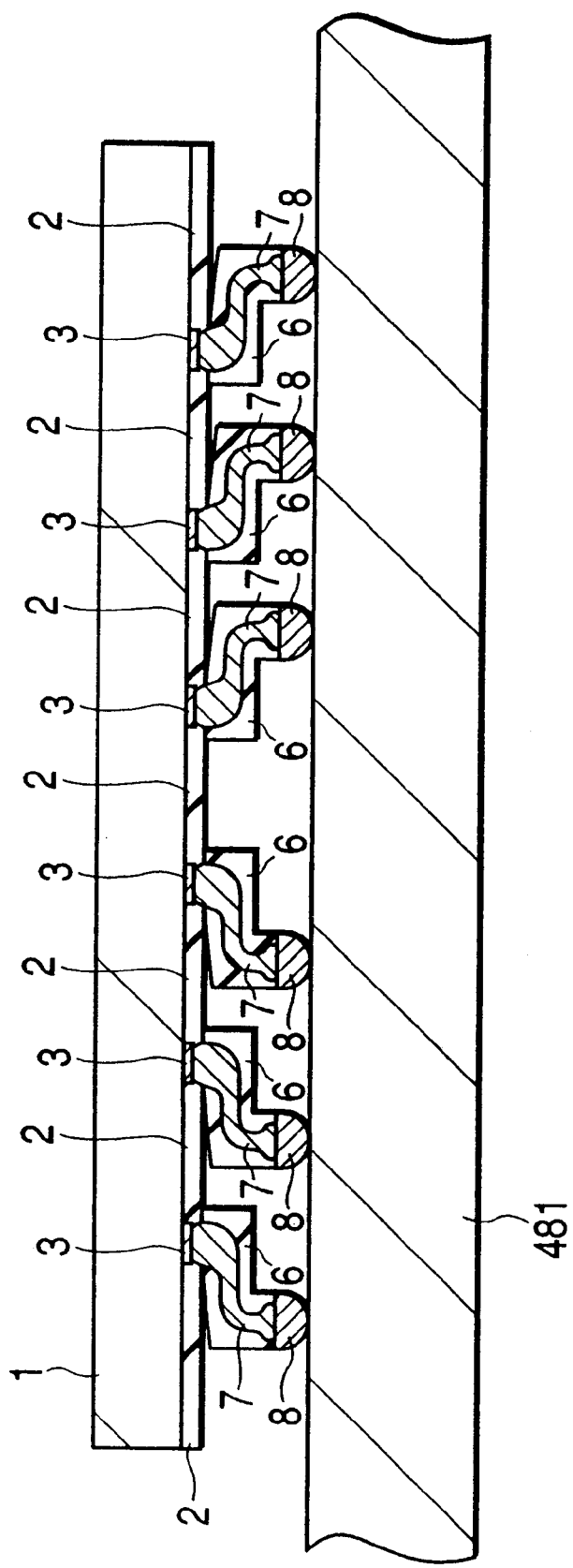
FIG. 48 is a cross-sectional view of a key part of a substrate showing a post-processing of a method of manufacturing a semiconductor integrated circuit device relating to the embodiments of the invention.

Further, as shown in FIG. 6, a solder bump 8 (a bump electrode) is formed on the respective bump electrode contact areas BA corresponding to the copper wire 7 by a ball transfer method, a screen printing method, or a solder plating (tinning) method or the like. Thereafter, the substrate 1 in a wafer state is died and divided into a plurality of chips. The chips are packaged as shown in FIG. 48, for example. In other words, the chips are mounted facedown on a packaging substrate 481, and the bump electrodes 8 are reflow soldered. An under-fill resin may be filled between the chips and the packaging substrate 481.

As explained above, according to the present embodiment, by utilizing a photocurable resin, resin near the metal wiring formation area, which extends from the respective electrode parts before rearrangement BP to the respective bump electrode contact areas BA, is cured, thereby obtaining the guide layers 6 for the metal wires. And then, the metal wires 7 are formed. Therefore, it is possible to form both the metal wires 7 and the cured resin parts 6 working as both the guide layers and the protection films for protecting these metal wires can be formed in relatively simple processes and with high precision. Further, according to the present embodiment, it is possible to form the S-shaped metal wires 7 easily, and it is possible to relax stress generated between the chips and the packaging substrate 481.

Embodiment 2

Next, a method of manufacturing a semiconductor integrated circuit device, which is embodiment 2 of the present invention, will be explained with reference to FIG. 7 to FIG. 16 in sequence.

Figure 7:
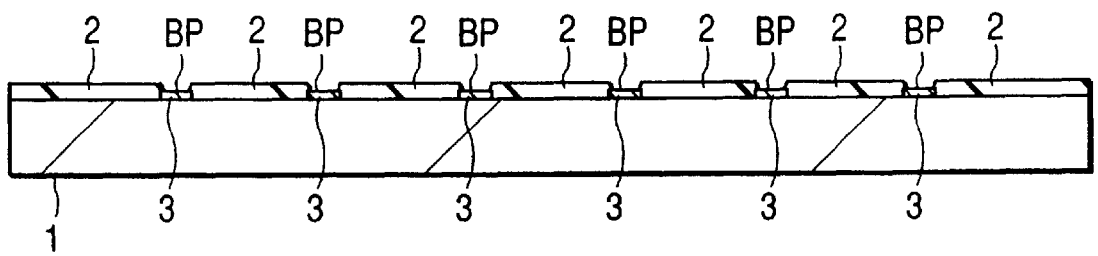
FIG. 7 is a cross-sectional view of a key part of a substrate showing a method of manufacturing a semiconductor integrated circuit device relating to embodiment 2 of the invention.

As shown in FIG. 7, a protection layer 2 (an insulation film) consisting of an inorganic passivation film and an organic passivation film like a polyimide resin is formed on a substrate 1, in a similar manner to that of the embodiment 1. Parts of the protection layer 2 are removed so as to expose a part of each of these top-layer wires 3 as each of the electrode parts before rearrangement BP.

Figure 8:
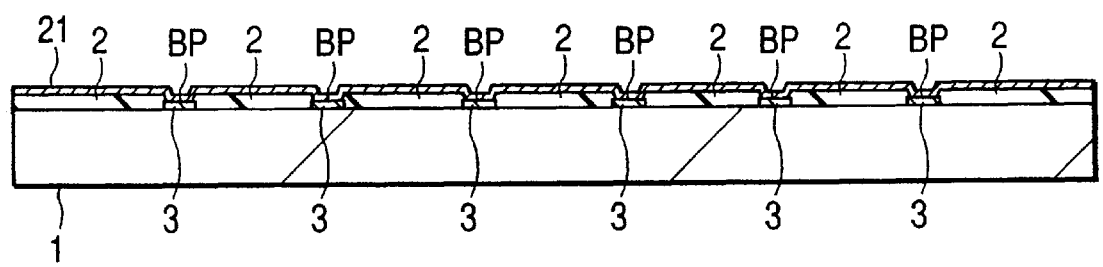
FIG. 8 is a cross-sectional view of a key part of a substrate showing a method of manufacturing a semiconductor integrated circuit device relating to the embodiment 2 of the invention.
Figure 9:
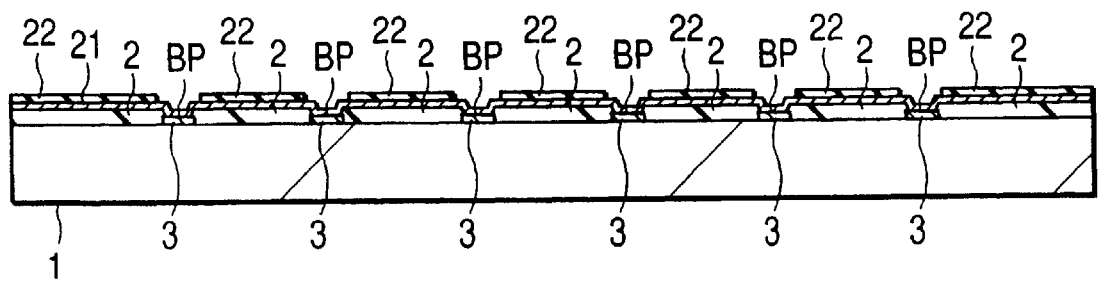
FIG. 9 is a cross-sectional view of a key part of a substrate showing a method of manufacturing a semiconductor integrated circuit device relating to the embodiment 2 of the invention.

Next, as shown in FIG. 8, a seed layer 21 (a metal seed layer) for electroplating is formed on the other parts of the protection layer 2 and the electrode parts before rearrangement BP. Further, as shown in FIG. 9, a resist film 22 is formed on the seed layer 21 for electrolytic plating, and then parts of the resist film 22 being arranged on and corresponding to the respective electrode parts before rearrangement BP is removed by photolithography.

Figure 10:
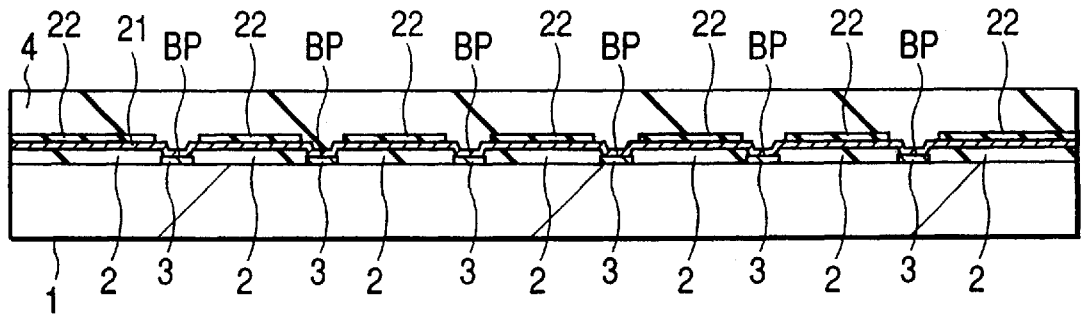
FIG. 10 is a cross-sectional view of a key part of a substrate showing a method of manufacturing a semiconductor integrated circuit device relating to the embodiment 2 of the invention.
Figure 11:
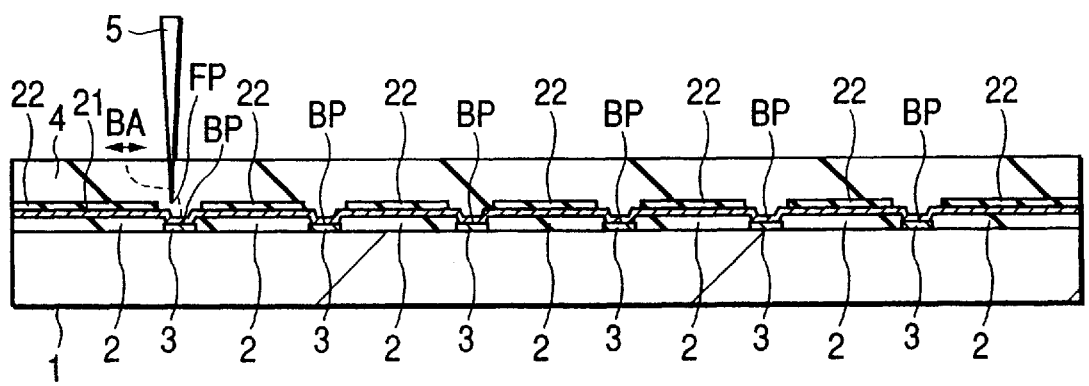
FIG. 11 is a cross-sectional view of a key part of a substrate showing a method of manufacturing a semiconductor integrated circuit device relating to the embodiment 2 of the invention.

Hereafter, as shown in FIG. 10, a photocurable resin is coated on the resist film 22 and the electrode part before rearrangement BP, thereby forming a photocurable resin layer 4, in a similar manner to that of the first embodiment. Thereafter, as shown in FIG. 11, the photocurable resin layer 4 at the peripheral portion of a metal wiring formation area (a broken-line part shown in FIG. 11) is cured by scanning the light-focusing part FP with a laser beam 5 on the peripheral portion of this metal wiring formation area from the respective electrode parts before rearrangement BP to respective bump electrode contact areas BA.

Figure 12:
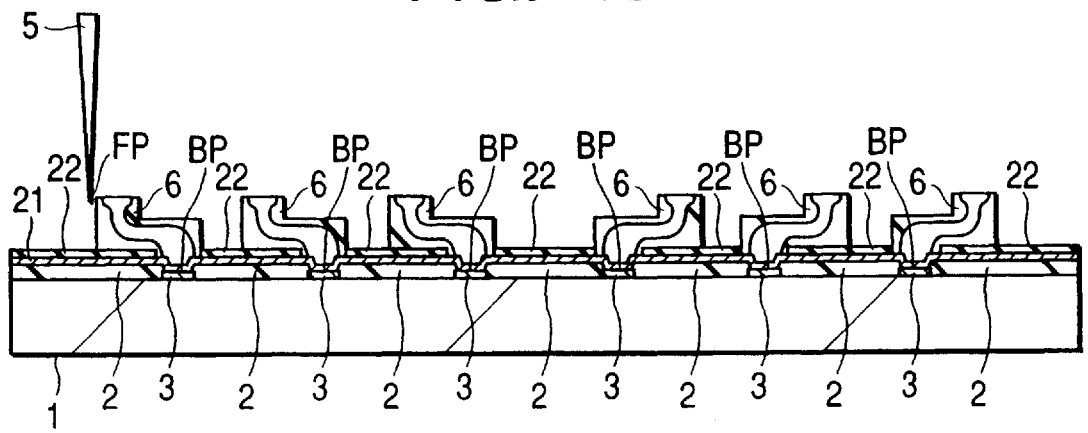
FIG. 12 is a cross-sectional view of a key part of a substrate showing a method of manufacturing a semiconductor integrated circuit device relating to the embodiment 2 of the invention.

Next, respective uncured portions of the photocurable resin layer 4 are removed to provide respective cylindrical cured resin parts 6 (guide layers) having the metal wiring formation area formed in a hollow shape, as shown in FIG. 12.

Figure 13:
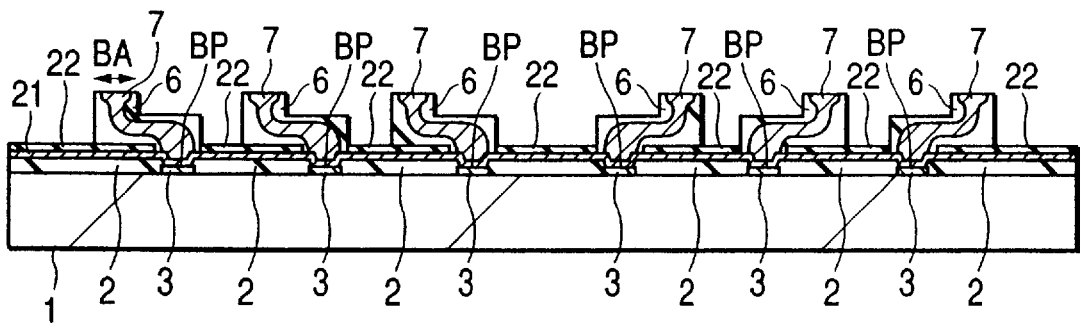
FIG. 13 is a cross-sectional view of a key part of a substrate showing a method of manufacturing a semiconductor integrated circuit device relating to the embodiment 2 of the invention.

Next, copper is grown inside each of the cured resin parts 6 by electroplating, thereby forming copper wires 7 (the metal wires) that extends from the respective electrode parts before rearrangement BP to the respective bump electrode contact areas BA, as shown in FIG. 13.

Figure 14:
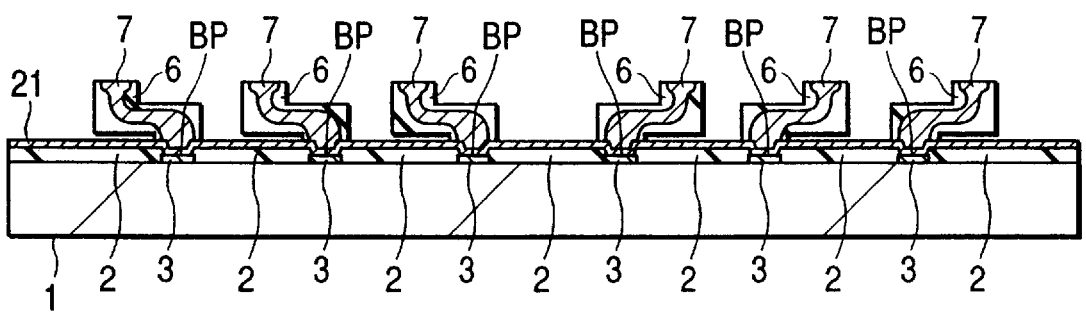
FIG. 14 is a cross-sectional view of a key part of a substrate showing a method of manufacturing a semiconductor integrated circuit device relating to the embodiment 2 of the invention.
Figure 15:
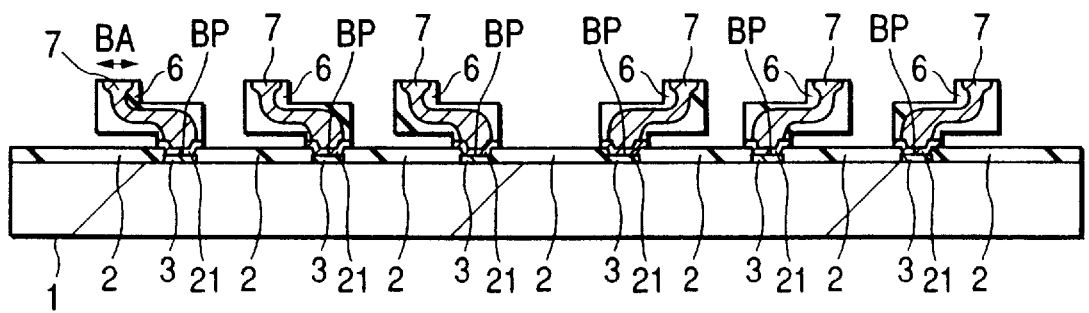
FIG. 15 is a cross-sectional view of a key part of a substrate showing a method of manufacturing a semiconductor integrated circuit device relating to the embodiment 2 of the invention.

Thereafter, the resist film 22 is removed as shown in FIG. 14, and the seed layer 21 for electroplating is removed by light etching, as shown in FIG. 15.

Figure 16:
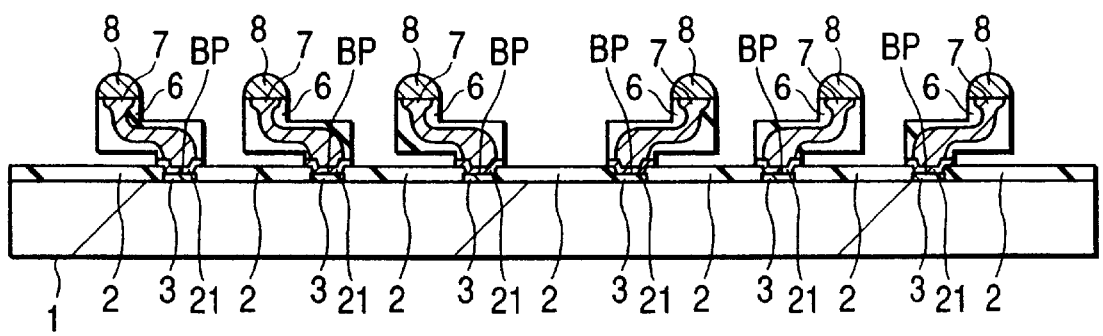
FIG. 16 is a cross-sectional view of a key part of a substrate showing a method of manufacturing a semiconductor integrated circuit device relating to the embodiment 2 of the invention.

Further, as shown in FIG. 16, a solder bump 8 (a bump electrode) is formed on the each of bump electrode contact areas BA in the copper wires 7 by a ball transfer method or a screen printing method or the like. It is also possible to form the solder bump 8 by electroplating. In the case of forming the solder bump 8 by electroplating, solder may be grown after the above-mentioned copper wires 7 (metal wires) is formed.

Thereafter, the substrate 1 in a wafer state is died, thereby being divided into a plurality of chips, and the chips are packaged.

As explained above, according to the present embodiment, the seed layer 21 for electroplating is formed on the respective electrode parts before rearrangement BP, and the copper wires 7 is formed by electroplating. Therefore, the growth speed of the plating becomes fast, so that it becomes possible to carry out a prompt processing for forming the copper wires. Particularly, this method is suitable for forming a long slender copper wire.

Embodiment 3

A method of manufacturing a semiconductor integrated circuit device, which is embodiment 3 of the present invention, will be explained with reference to FIG. 17 to FIG. 26 in sequence.

Figure 17:
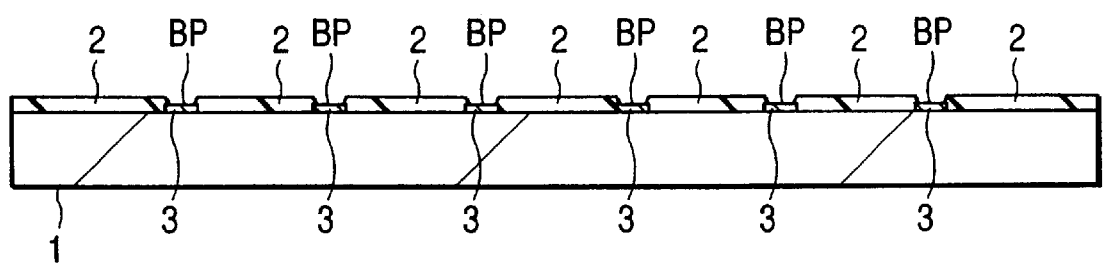
FIG. 17 is a cross-sectional view of a key part of a substrate showing a method of manufacturing a semiconductor integrated circuit device relating to embodiment 3 of the invention.

As shown in FIG. 17, a protection layer 2 (an insulation film) consisting of an inorganic passivation film and an organic passivation film like a polyimide resin is formed on a substrate 1, in a similar manner to that of the embodiment 1. Parts of the protection layer 2 have been removed so as to expose parts of the top-layer wires 3 as electrode parts before rearrangement BP.

Figure 18:
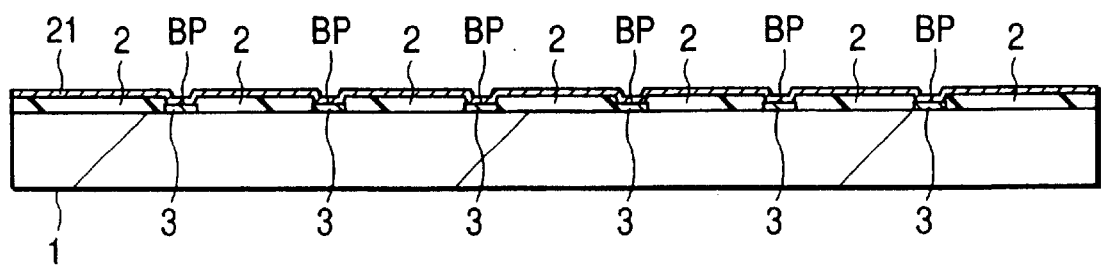
FIG. 18 is a cross-sectional view of a key part of a substrate showing a method of manufacturing a semiconductor integrated circuit device relating to embodiment 3 of the invention.
Figure 19:
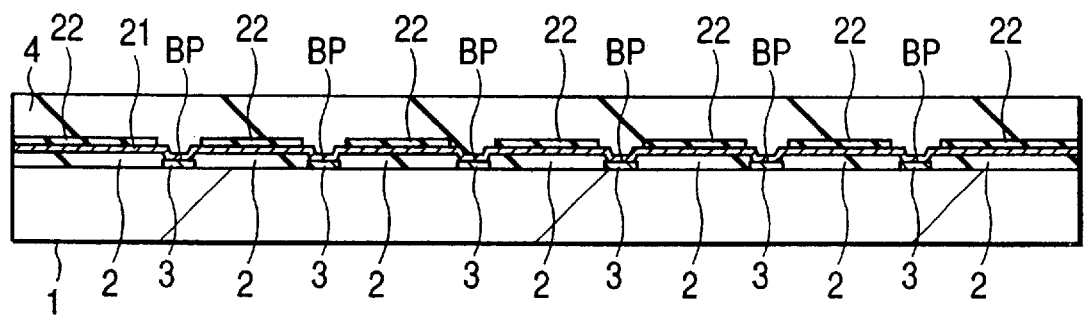
FIG. 19 is a cross-sectional view of a key part of a substrate showing a method of manufacturing a semiconductor integrated circuit device relating to the embodiment 3 of the invention.

Next, as shown in FIG. 18, a seed layer 21 for electroplating is formed on the protection layer 2 and the electrode parts before rearrangement BP. Further, as shown in FIG. 19, a resist film 22 is formed on the seed layer 21 for electroplating, and then parts of the resist film 22 being arranged on and corresponding to the electrode parts before rearrangement BP is removed by photolithography. Thereafter, a photocurable resin layer 4 is coated on the other parts of the resist film 22 and the electrode parts before rearrangement BP.

Figure 20:
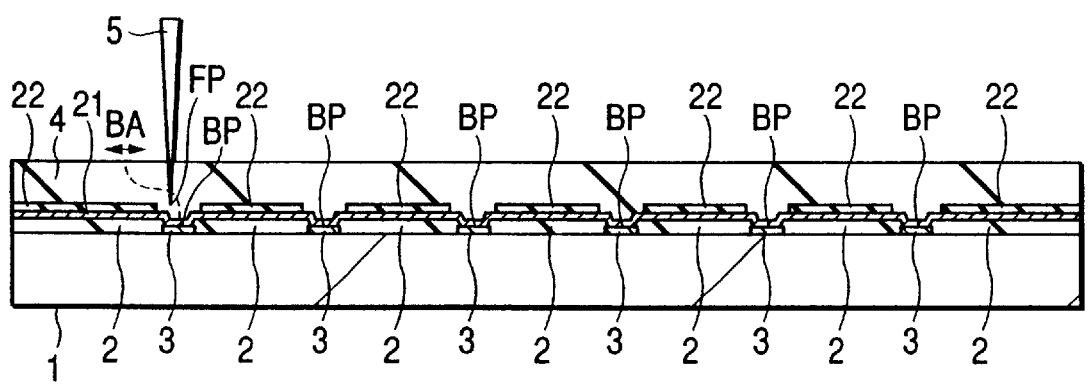
FIG. 20 is a cross-sectional view of a key part of a substrate showing a method of manufacturing a semiconductor integrated circuit device relating to the embodiment 3 of the invention.

Next, as shown in FIG. 20, the photocurable resin at the peripheral portion of a metal wiring formation area (a broken-line part shown in FIG. 20) is cured by scanning the light-focusing part FP with a laser beam 5 on the peripheral portion of this metal wiring formation area from the respective electrode parts before rearrangement BP to respective bump electrode contact areas BA. In this case, the scanning is carried out with such laser beam 5 that respective areas OA larger than the respective bump electrode contact areas BA become an aperture in the photocurable resin layer 4 cured (FIG. 21).

Figure 21:
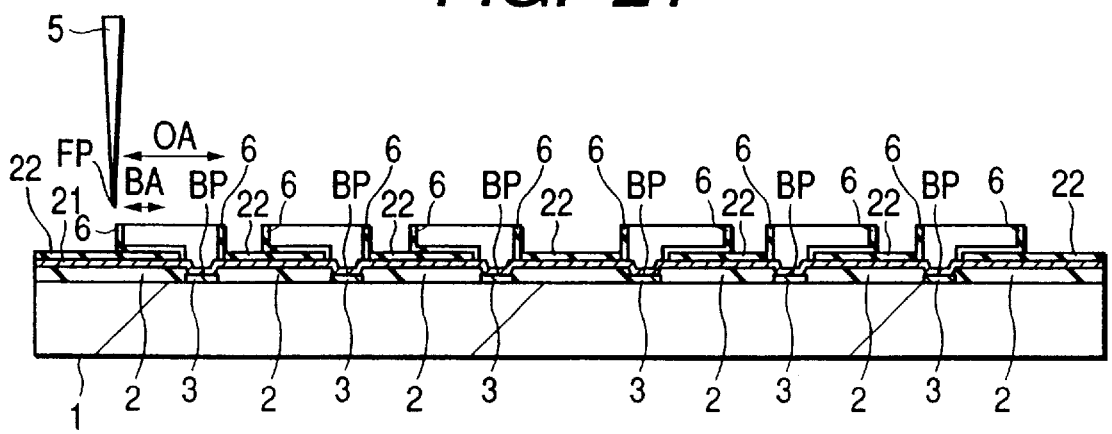
FIG. 21 is a cross-sectional view of a key part of a substrate showing a method of manufacturing a semiconductor integrated circuit device relating to the embodiment 3 of the invention.

Next, uncured portions of the photocurable resin layer 4 are removed, and then each of cured resin parts 6 (guide layers) in which the metal wiring formation area has a hollow shape is provided, as shown in FIG. 21. Each of these cured resin parts 6 has a shape that the areas OA larger than the bump electrode contact areas BA are open, respectively.

Figure 22:
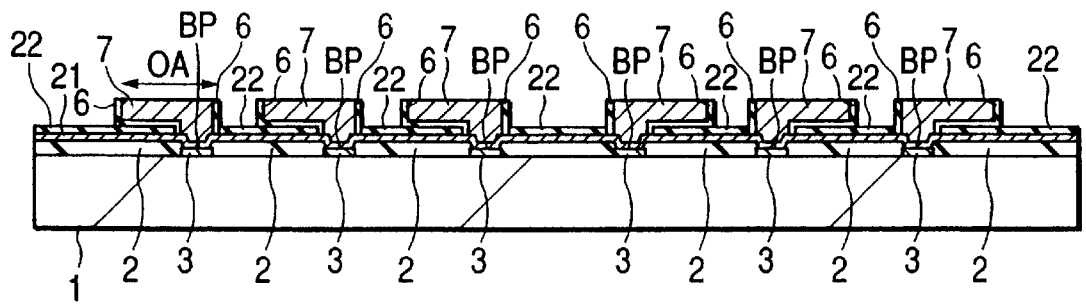
FIG. 22 is a cross-sectional view of a key part of a substrate showing a method of manufacturing a semiconductor integrated circuit device relating to the embodiment 3 of the invention.

Next, copper is grown in side each of the cured resin parts 6 by electroplating, thereby forming copper wires 7 (the metal wires) that extend from the electrode parts before rearrangement BP to the areas OA, as shown in FIG. 22. In this case, when unevenness has occurred on some surfaces of the copper wires 7, these surfaces are flattened using a chemical mechanical polishing (CMP) method, for example.

Figure 23:
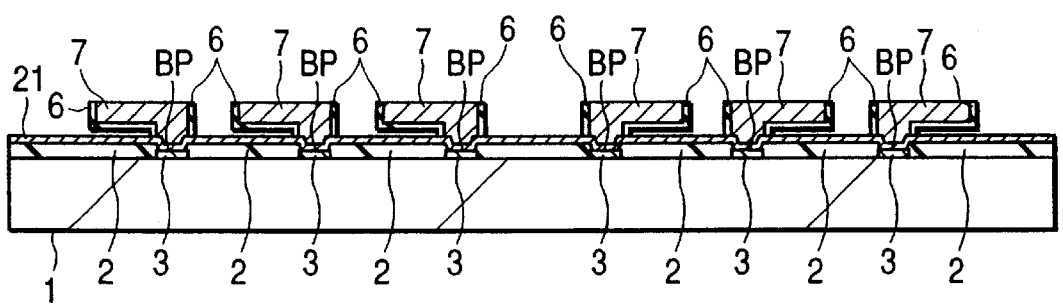
FIG. 23 is a cross-sectional view of a key part of a substrate showing a method of manufacturing a semiconductor integrated circuit device relating to the embodiment 3 of the invention.
Figure 24:
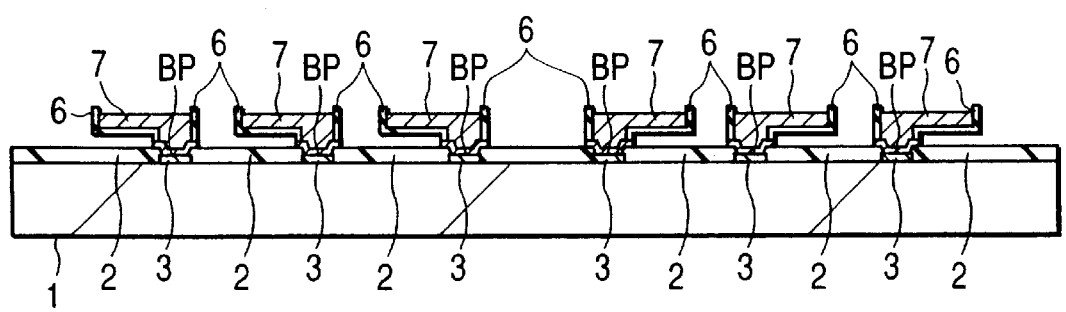
FIG. 24 is a cross-sectional view of a key part of a substrate showing a method of manufacturing a semiconductor integrated circuit device relating to the embodiment 3 of the invention.

Thereafter, the resist film 22 is removed as shown in FIG. 23, and then the seed layer 21 for electroplating is removed by light etching, as shown in FIG. 24.

Figure 25:
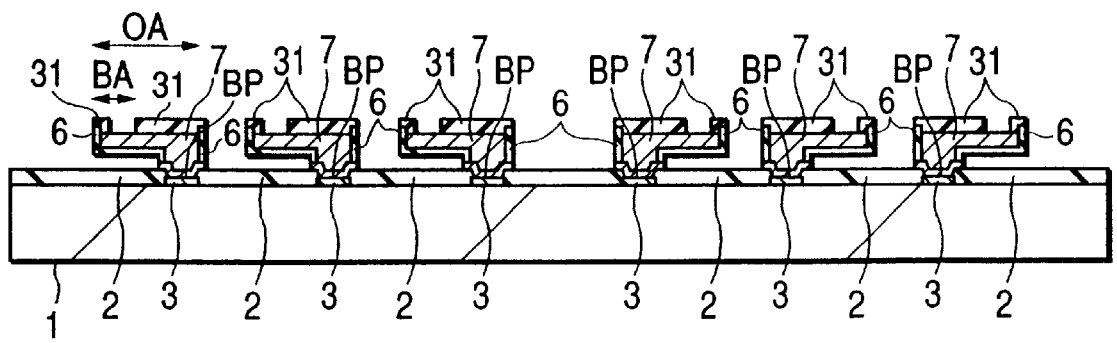
FIG. 25 is a cross-sectional view of a key part of a substrate showing a method of manufacturing a semiconductor integrated circuit device relating to the embodiment 3 of the invention.
Figure 26:
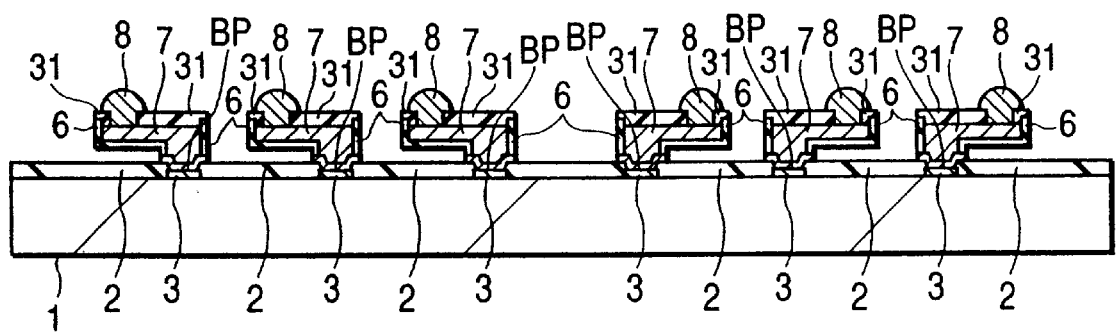
FIG. 26 is a cross-sectional view of a key part of a substrate showing a method of manufacturing a semiconductor integrated circuit device relating to the embodiment 3 of the invention.

Further, as shown in FIG. 25, an insulation film 31 is formed on the areas OA arranged on the copper wires 7, and then parts of the insulation film 31 being on and corresponding to the bump electrode contact areas BA are removed by etching. For forming this insulation film 31, a printing method may be used, or a photocurable resin may be used to form this insulation film again Next, as shown in FIG. 26, solder bumps 8 (bump electrodes) are respectively formed on the bump electrode contact areas BA by a ball transfer method or by a screen printing method or the like. Thereafter, the substrate 1 in a wafer state is died thereby being divided into a plurality of chips, and the chips are packaged.

As explained above, according to the present embodiment, each of the cured resin parts 6 is formed so that each of the areas OA including the bump electrode contact areas BA has an open shape. Therefore, in following electroplating process, a plating liquid is supplied from this aperture in each of the areas OA, and the growth speed of the plating becomes fast, so that it becomes possible to reduce the processing time. Even in the case of forming copper wires by nonelectrode plating without forming the seed layer 21 for electroplating, if the cured resin parts 6 having the same shape are formed, then the plating liquid is supplied from the apertures thereof, and the growth speed of the plating becomes fast.

Embodiment 4

Next a method of manufacturing a semiconductor integrated circuit device, which is embodiment 4 of the present invention will be explained with reference to FIG. 27 to FIG. 32 in sequence.

Figure 27:
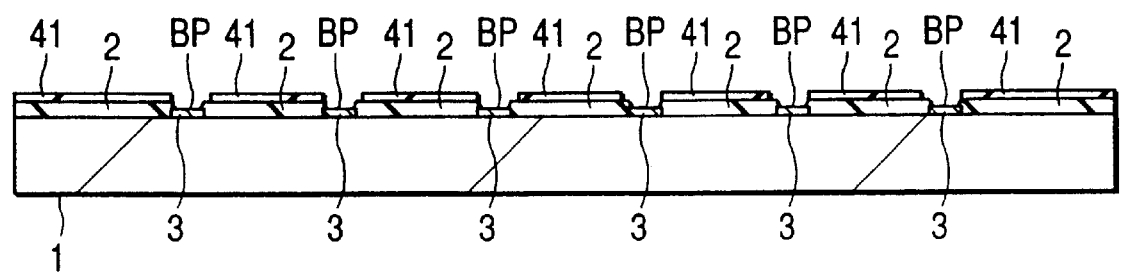
FIG. 27 is a cross-sectional view of a key part of a substrate showing a method of manufacturing a semiconductor integrated circuit device relating to embodiment 4 of the invention.

As shown in FIG. 27, a protection layer 2 (an insulation film) consisting of an inorganic passivation film and an organic passivation film like a polyimide resin is formed on a substrate 1, in a similar manner to that of the first embodiment. Parts of the protection layer 2 are removed so as to expose respective parts of top-layer wires 3 as an electrode parts before rearrangement BP. Of a resist film 41 formed on both the others of the protection layer 2 and the electrode parts before rearrangement BP, parts of the resist film 41 being on and corresponding to the electrode parts before rearrangement BP are removed by photolithography. This resist film 41 is provided for preventing copper wires 7 described later from being closely adhered to the protection layer 2.

Next, a photocurable resin is coated on others of the resist film 41 and the electrode parts before rearrangement BP. Then, the photocurable resin at the peripheral portion of a metal wiring formation area is cured by scanning a light-focusing part of a laser beam on the peripheral portion of this metal wiring formation area that extends from the respective electrode parts before rearrangement BP to respective bump electrode contact areas BA. In this case, the scanning is carried out with a laser beam so that apertures 42 (induction holes) are formed on parts of the resist film 41 positioned beneath the bump electrode contact areas BA (a part of lower areas) (FIG. 28), respectively.

Figure 28:
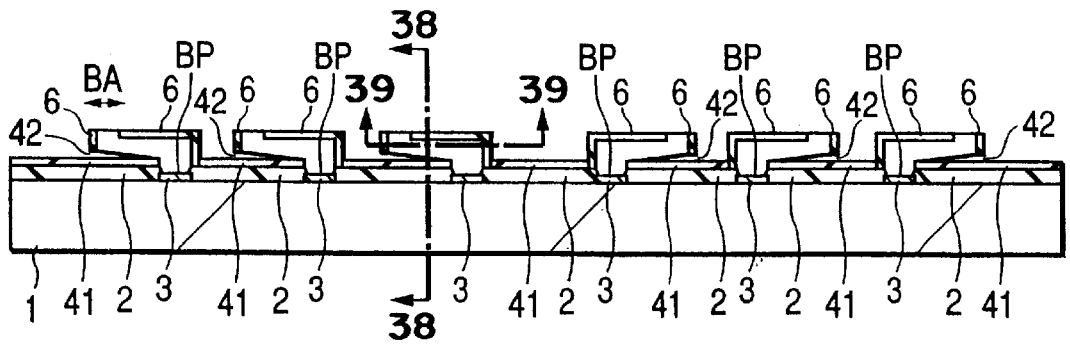
FIG. 28 is a cross-sectional view of a key part of a substrate showing a method of manufacturing a semiconductor integrated circuit device relating to the embodiment 4 of the invention.

Next, uncured portions of the photocurable resin layer are removed, and thereby each of cured resin parts 6 (guide layers) in which the metal wiring formation area has a hollow shape is provided, as shown in FIG. 28. This cured resin parts 6 have the apertures 42 (the induction holes) on the parts of the resist film positioned beneath the bump electrode contact areas BA, respectively.

Figure 29:
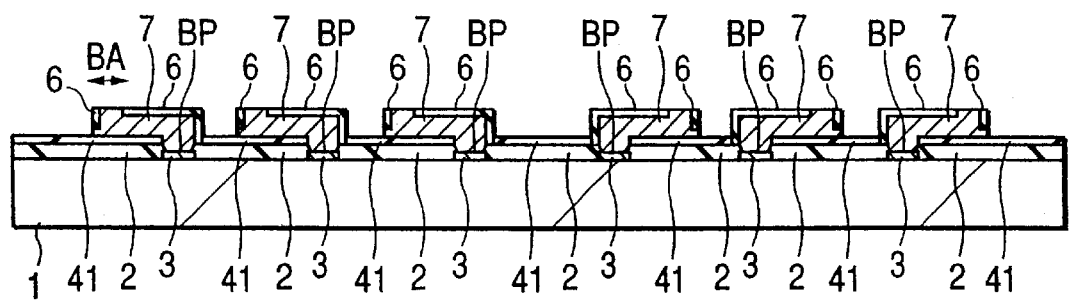
FIG. 29 is a cross-sectional view of a key part of a substrate showing a method of manufacturing a semiconductor integrated circuit device relating to the embodiment 4 of the invention.

Next, copper is grown inside each of the cured resin parts 6 by dipping the substrate 1 into a copper electroplating liquid, as shown in FIG. 29. Thus, copper wires 7 (the metal wires) are formed which that extend from the electrode parts before rearrangement BP to the bump electrode contact areas BA, respectively.

Figure 30:
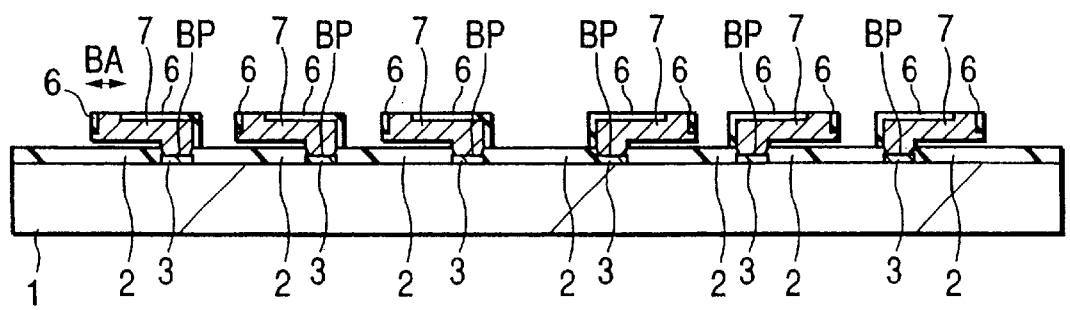
FIG. 30 is a cross-sectional view of a key part of a substrate showing a method of manufacturing a semiconductor integrated circuit device relating to the embodiment 4 of the invention.
Figure 31:
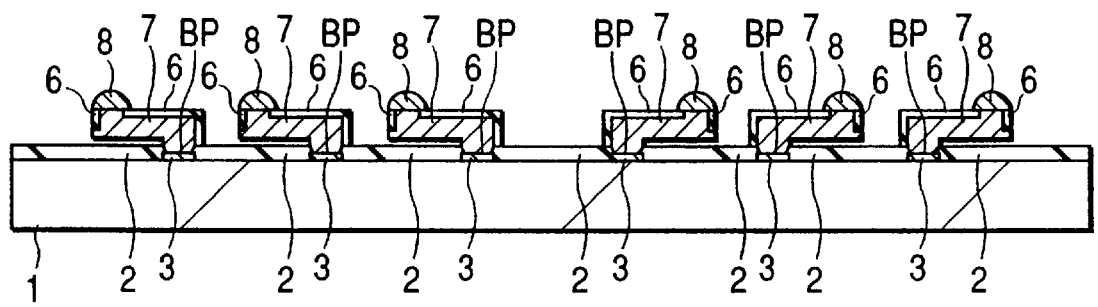
FIG. 31 is a cross-sectional view of a key part of a substrate showing a method of manufacturing a semiconductor integrated circuit device relating to the embodiment 4 of the invention.
Figure 32:
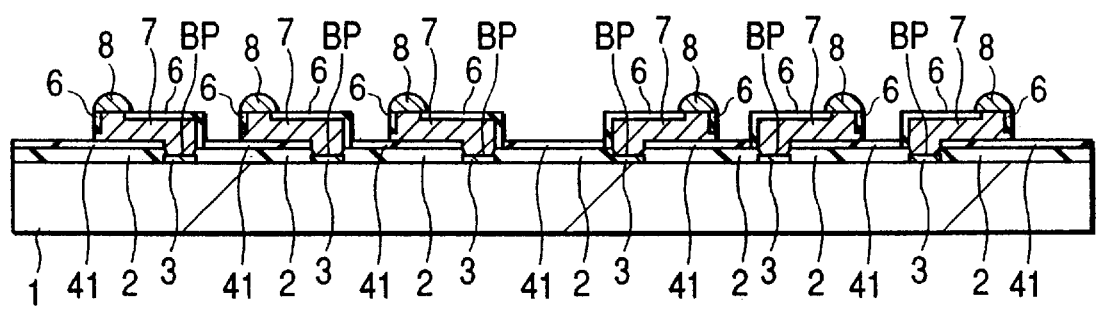
FIG. 32 is a cross-sectional view of a key part of a substrate showing a method of manufacturing a semiconductor integrated circuit device relating to the embodiment 4 of the invention.

Thereafter, the resist film 41 is removed as shown in FIG. 30. As shown in FIG. 32, it is unnecessary to remove the resist film 41 if the resist film is made of a soft material. Further, as shown in FIG. 31, solder bumps 8 (bump electrodes) are respectively formed on the bump electrode contact areas BA by a ball transfer method, a screen printing method or the like. Thereafter, the substrate 1 in a wafer state is died, thereby being divided into a plurality of chips, and the chips are packaged.

As explained above, according to the present embodiment, the cured resin parts 6 are formed to have the apertures (induction holes) 42 on corresponding parts of the resin film 41 positioned beneath the bump electrode contact areas BA, respectively. Therefore, in the nonelectrode plating process, a plating liquid is supplied from the respective apertures 42 therein, and the growth speed of the plating becomes fast, so that it becomes possible to reduce the processing time.

Embodiment 5

Next a method of manufacturing a semiconductor integrated circuit device, which is embodiment 5 of the present invention, will be explained with reference to FIG. 33 to FIG. 37 in sequence.

Figure 33:
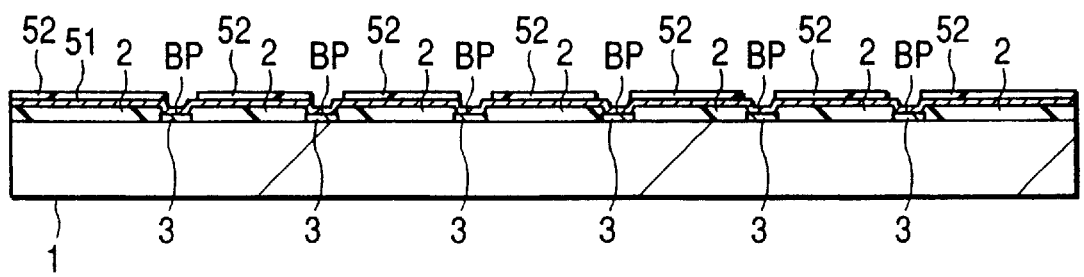
FIG. 33 is a cross-sectional view of a key part of a substrate showing a method of manufacturing a semiconductor integrated circuit device relating to embodiment 5 of the invention.

As shown in FIG. 33, a protection layer 2 (an insulation film) consisting of an inorganic passivation film and an organic passivation film like a polyimide resin is formed on a substrate 1, in a similar manner to that of the first embodiment. Thereafter, parts of the protection layer 2 are removed so as to expose parts of these top-layer wires 3 as electrode parts before rearrangement BP, respectively. A seed layer 51 for electroplating is formed on the electrode parts before rearrangement BP and the other parts of the protection layer 2. Further, a resist film 52 is formed on the seed layer 51 for electroplating. Parts of the resist film 52 being on and corresponding to the electrode parts before rearrangement BP are removed by photolithography, and parts of the seed layer 51 for electroplating are exposed outside.

Hereafter, similarly to the embodiment 4, a photocurable resin layer is formed on both the resist film 52 and the seed layer 51 for electroplating, which is positioned on the electrode parts before rearrangement BP. Then, the photocurable resin at the peripheral portion of metal wiring formation area is cured by scanning a light-focusing part of a laser beam on the peripheral portion of this metal wiring formation area from the respective electrode parts before rearrangement BP to respective bump electrode contact areas BA. In this case, the scanning is carried out with the laser beam so that apertures 53 (induction holes) are formed on corresponding parts of the resist film 52 positioned beneath the bump electrode contact areas BA (lower areas) (FIG. 34).

Figure 34:
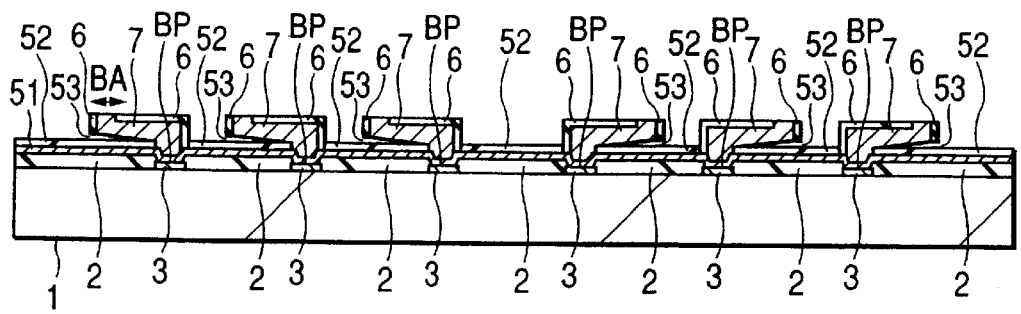
FIG. 34 is a cross-sectional view of a key part of a substrate showing a method of manufacturing a semiconductor integrated circuit device relating to the embodiment 5 of the invention.

Next, uncured portions of the photocurable resin are removed, and thereby each of cured resin parts 6 (guide layers) in which the metal wiring formation area has a hollow shape is provided, as shown in FIG. 34. These cured resin parts 6 have apertures 53 (induction holes) on corresponding parts of the resist film 52 positioned beneath the bump electrode contact areas BA, respectively.

Figure 35:
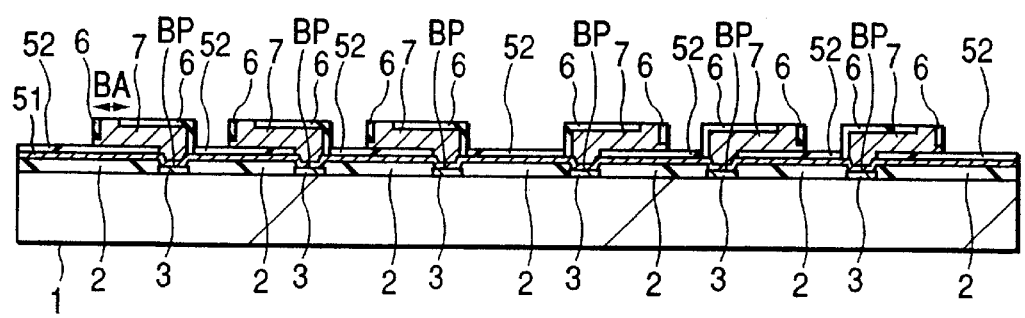
FIG. 35 is a cross-sectional view of a key part of a substrate showing a method of manufacturing a semiconductor integrated circuit device relating to the embodiment 5 of the invention.

Next, copper is grown inside each of the cured resin parts 6 by electroplating, thereby forming copper wires 7 (the metal wires) that extend from the electrode parts before rearrangement BP to the bump electrode contact areas BA, respectively, as shown in FIG. 35.

Figure 36:
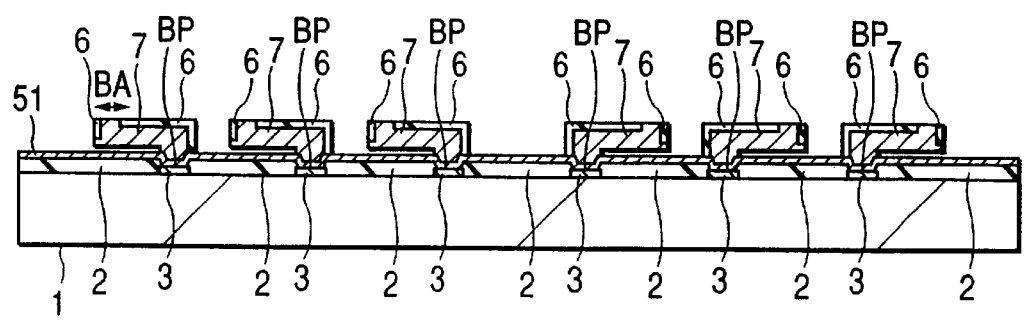
FIG. 36 is a cross-sectional view of a key part of a substrate showing a method of manufacturing a semiconductor integrated circuit device relating to the embodiment 5 of the invention.
Figure 37:
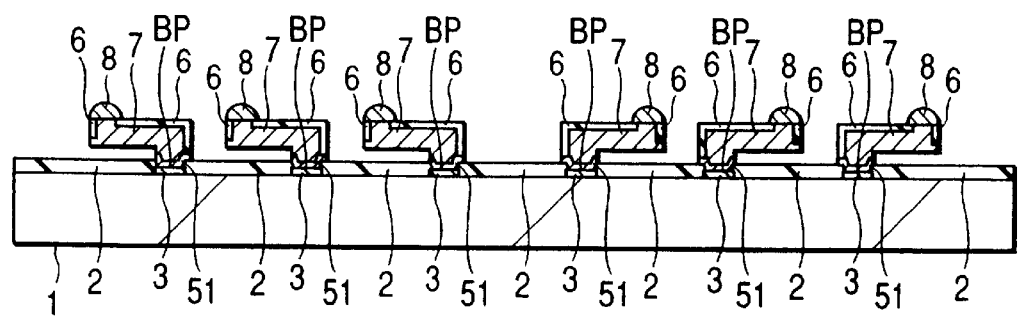
FIG. 37 is a cross-sectional view of a key part of a substrate showing a method of manufacturing a semiconductor integrated circuit device relating to the embodiment 5 of the invention.

Thereafter, the resist film 52 is removed as shown in FIG. 36. Further, the seed layer 51 for electrolytic plating is removed by light etching, as shown in FIG. 37. Next, a solder bumps 8 (bump electrodes) are respectively formed on the bump electrode contact areas BA by a ball transfer method, by a screen printing method or the like.

In the case of forming the solder bumps 8 by electroplating, solder may be grown after the copper wires 7 (the metal wires) are formed. Thereafter, the substrate 1 in a wafer state is died, thereby being divided into a plurality of chips, and the chips are packaged.

As explained above, according to the present embodiment, the seed layer 51 for electroplating is formed on each of the electrode parts before rearrangement BP, and the copper wires 7 are formed by electroplating. Therefore, the growth speed of the plating becomes fast. Further, as the cured resin parts 6 have the apertures (the induction holes) 53 on corresponding parts of the resist film 52 positioned beneath the bump electrode contact area BA, the plating liquid is supplied from respective apertures 53 therein. As a result, the growth speed of the plating becomes faster, and it becomes possible to reduce the processing time.

Embodiment 6

When the Embodiments 1 to 5 in common have the same layout of the electrode parts before rearrangement as that of the layout of the bump electrodes and the same copper wires in shape, it is possible to install an optical system for branching a laser beam into a plurality of beams and to form a plurality of cured resin parts 6 simultaneously, in order to increase the throughput of the cured resin parts 6. In this case, the optical system of the device is designed so that intervals of the laser beams match pitches between the bump electrodes.

When the plurality of branched laser beams are used, it is possible to simultaneously form a plurality of cured resin parts 6 as explained above. Therefore, it becomes possible to eminently reduce the processing time.

Embodiment 7

Next, each shape of the cured resin parts 6 will be explained with reference to FIG. 28 explained in the embodiment 4, and FIGS. 38(a) and 38(b) and FIGS. 39(a) to 39(c). FIGS. 38(a) and 38(b) show cross-sectional views taken along a line A–A' in FIG. 28, respectively. As shown in FIG. 38(a),each cross section of the cured resin parts 6 formed on the resist film 41 taken along the line A–A' (FIG. 28), can have a square shape. Further, as shown in FIG. 38(b), each cross section of the cured resin parts 6 taken along the line A–A' (FIG. 28), may have a semicircle shape (an inverse U shape). Further, it is also possible to form each cross section of the cured resin parts 6 in a U shape not shown.

FIGS. 39(a) to 39(c) show cross-sectional views of the cured resin parts taken along a line B–B' in FIG. 28, respectively. As shown in FIGS. 39(a) to 39(c), the cured resin parts 6 are formed to cover the electrode parts before rearrangement BP and the respective bump electrode formation areas BA, respectively. Each cross section of the cured resin parts 6 taken along the line B–B' (FIG. 28) has such a shape as to surround the respective electrode parts before rearrangement BP and the respective bump electrode formation areas BA. Further, as shown in FIG. 39(a), it is possible to form the each cross section of the cured resin parts 6 taken along the line B–B' in a taper shape from the respective electrode parts before rearrangement BP toward the respective bump electrode formation areas BA. Further, as shown in FIG. 39(b), it is possible to form the each cross section of the cured resin parts 6 taken along the line B–B' in such a shape as to have a narrow part between the electrode parts before rearrangement BP and the bump electrode formation areas BA. Further, as shown in FIG.

39(c), it is also possible to form the each cross section of the cured resin parts 6 taken along the line B–B' in such an approximately rectangular shape as to encircle the respective electrode parts before rearrangement BP and the respective bump electrode formation areas BA.

The shapes of the cured resin parts 6 are explained above with reference to FIG. 28, FIGS. 38(*a*) and 38(*b*) and FIGS. 39(*a*) to 39(*c*). Not only in the embodiment 4 but also the embodiment 1, 2, 3 and 5, it is also possible to form the each cross section of the cured resin parts in a similar shape. Each cross section of the cured resin parts 6 in the embodiment 1 is formed in such a semicircle shape (an inverse U shape) as to be explained with reference to FIG. 38(*b*). In addition, at the same time, each cross section of the cured resin parts 6 can have a narrow shape between the electrode parts before rearrangement BP and the bump electrode formation areas BA as explained with reference to FIG. 39(*c*).

Embodiment 8

Figure 40:
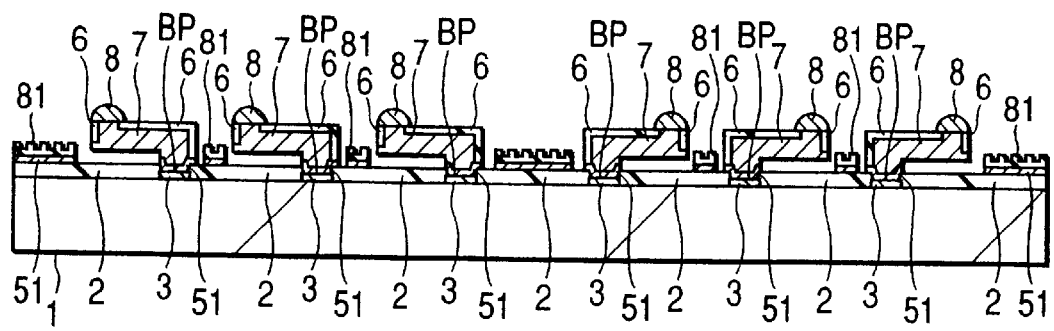
FIG. 40 is a cross-sectional view of a key part of a substrate showing a method of manufacturing a semiconductor integrated circuit device relating to embodiment 8 of the invention.

Further, it is also possible to provide radiating plates 81 by using a photocurable resin as shown in FIG. 40. In other words, after forming the photocurable resin layer on the resist film 52 and the electrode parts before rearrangement BP of FIG. 33 described in the embodiment 5, the scanning is performed with the laser beam to form the cured resin parts 6. At this time, the laser beam is irradiated onto the photocurable resin positioned at a portion other than the peripheral portions of the metal wiring formation area, thereby forming the uneven surface portions (81) (FIG. 40). These uneven surface portions play roles of the radiating plates. By forming these uneven surface portions, it is possible to effectively radiate heat created on active element formation surfaces of the substrate. Further, it is possible to form the radiating plates 81 in the same process as that for forming the cured resin parts 6 that become the guide parts of the metal wires. Therefore, it is possible to obtain the above-mentioned effects in a simple process.

The method in the present embodiment can also be applied to the Embodiments 1 to 4 as well as the embodiment 5.

Embodiment 9

In the Embodiments 1 to 5, the laser beam is irradiated onto the photocurable resin layer, and each of the cured resin parts 6 (the guide layers), in which the metal wiring formation area has a hollow shape, is provided. Then, the copper wires 7 are formed in these hollow-shaped parts. In stead of this, each of the above-mentioned photocurable resin parts can be used as the wiring layer if an electroplating is performed on each surface of the photocurable resin parts, each of which plays a role of a core.

First, a substrate having a protection layer (an insulation film) that is formed on the top-layer wires and from which each of the top-layer wires as the electrode parts before rearrangement is exposed, is prepared in a similar manner to that of the embodiment 1. Then, a photocurable resin layer is formed on the protection layer and the electrode parts before rearrangement (FIG. 3).

Figure 41:
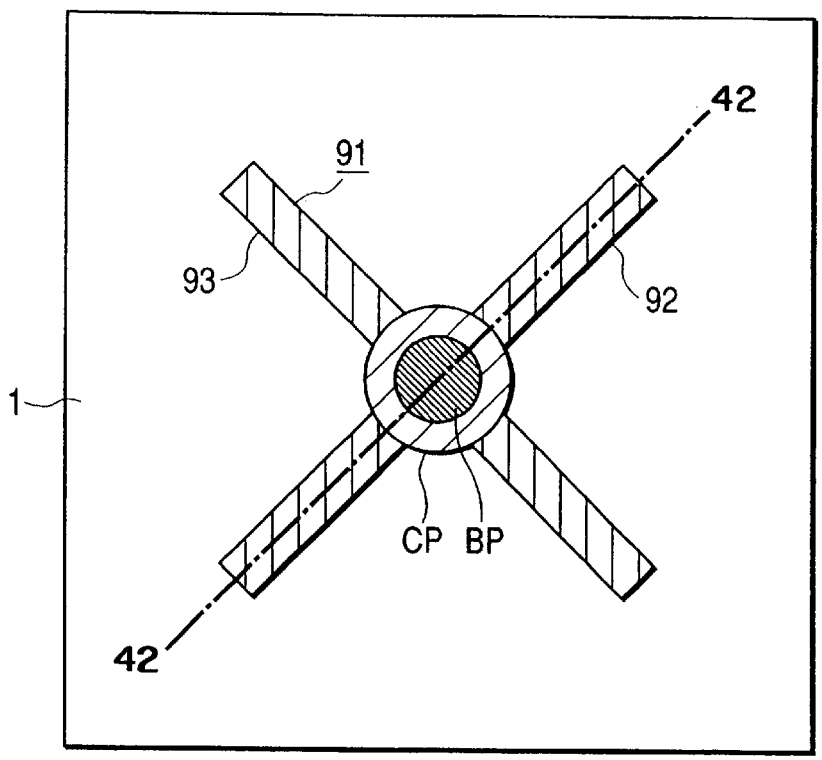
FIG. 41 is a top plane view of a key part of a substrate showing a method of manufacturing a semiconductor integrated circuit device relating to embodiment 9 of the invention.
Figure 42:
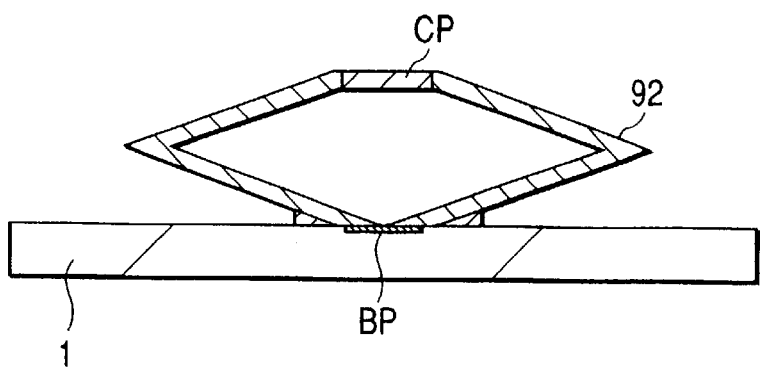
FIG. 42 is a cross-sectional view of a pantograph shape part taken along a line A–A' in FIG. 41.

Next, a laser beam is irradiated onto the photocurable resin layer, thereby bringing about a curing reaction of the photocurable resin layer at a light-focusing part of this beam. The light-focusing part is scanned to draw a shape having pantograph-shaped parts 92 and 93 crossed each other at a center part CP as shown in FIG. 41 and FIG. 42.

Next, uncured portions of the photocurable resin are removed. As a result, cured resin parts 91 having such a shape that the pantograph-shaped parts 92 and 93 cross each other at the center part CP, remain on the respective electrode parts before rearrangement BP. FIG. 41 shows a top plane view of each of the cured resin parts 91. FIG. 42 is a cross-sectional view of the pantograph-shaped parts 92 taken along a line A–A' of FIG. 41. The pantograph shape part 93 also has a similar shape.

Thereafter, activation processing of surfaces of the cured resin parts 91 is carried out. By this processing, cores for growing the plating are formed on the surfaces of the cured resin parts 91. Further, the substrate 1 is dipped into a copper nonelectrode plating liquid, thereby growing copper or gold on the respective surfaces of the cured resin parts 91 and forming a wiring layer on the respective surfaces of the cured resin parts. It is necessary to carry out the activation processing on only the surfaces of the cured resin parts 91. Therefore, before opening each of the electrode parts before rearrangement, it is necessary to carry out a water repellent finish on a surface of the substrate in advance, or to cover area of the substrate other than respective areas corresponding to the electrode parts before rearrangement, with a resist material.

As explained above, according to the present embodiment, a photocurable resin is utilized to form the respective cured resin parts 91 on each of the electrode parts before rearrangement BP. Thereafter, metal plating is provided on the respective surfaces of these cured resin parts 91 to form the metal wires. Therefore, it is possible to form the metal wires with high precision and in a relatively simple process.

In the present embodiment, the respective cured resin parts 91 are formed to have the pantograph shaped parts 92 and 93 crossed at the center part CP. In stead of this, it is also possible to provide each of the cured resin parts that has a shape extending from the respective electrode parts before rearrangement to the respective bump electrode contact areas. On the other hand, if the cured resin parts 91 are formed to have the pantograph-shaped parts 92 and 93 crossed at the center part CP as described in the present embodiment, it is possible for the cured resin parts to obtain improved stress durability.

Figure 43:
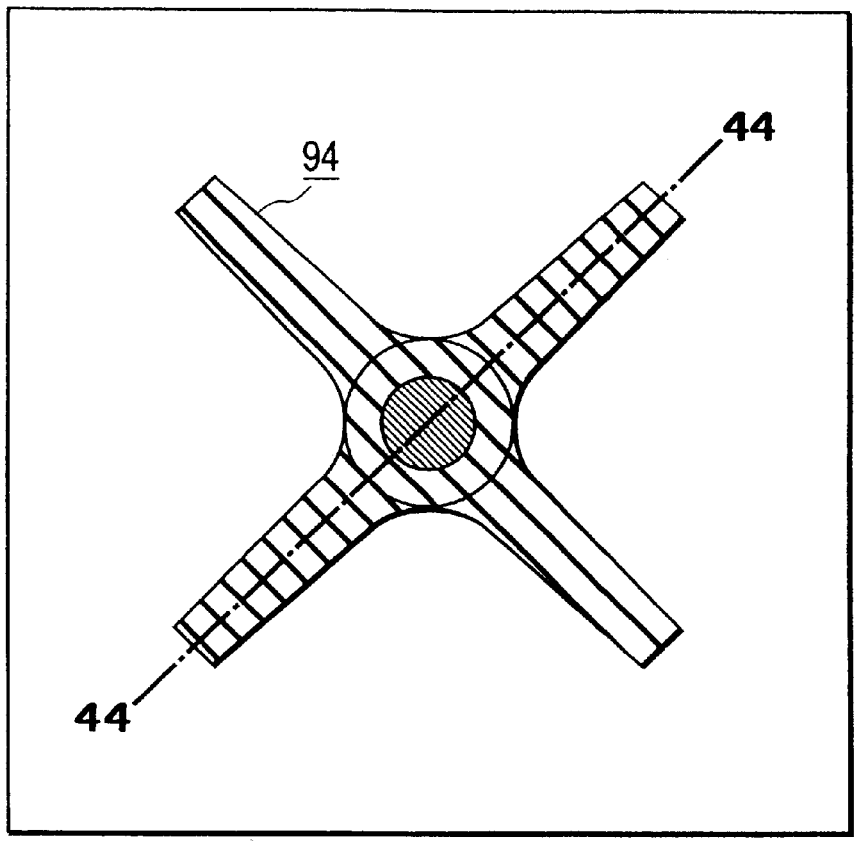
FIG. 43 is a top plane view of a key part of a substrate showing a method of manufacturing a semiconductor integrated circuit device relating to the embodiment 9 of the invention.
Figure 44:
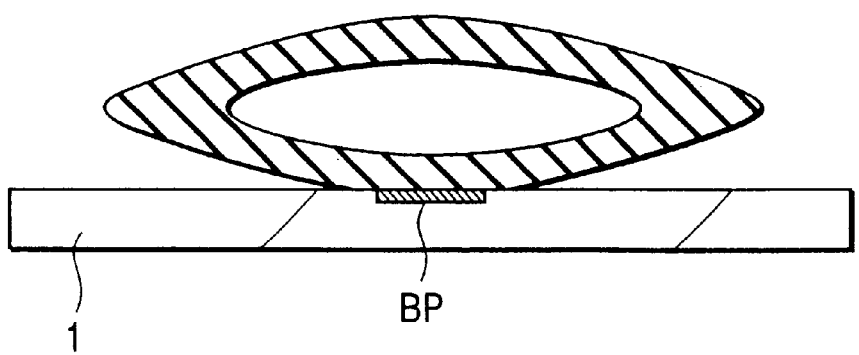
FIG. 44 is a cross-sectional view of a wiring layer taken along a line A–A' in FIG. 43.

Further, if a nickel alloy or the like is further plated on a surface of the above-described copper plating or gold plating, it is possible to reinforce the wiring layer as shown in FIG. 43 and FIG. 44. FIG. 43 is a top plane view of a wiring layer 94 obtained by plating a nickel alloy on a metal plating layer, after these metal wires are plated on the surfaces of the cured resin parts 91. FIG. 44 is a cross-sectional view taken along a line A–A' of FIG. 43.

Embodiment 10

Further, when this photocurable resin is used, it is possible to easily form an optical signal transmission path of a semiconductor integrated circuit device having an optical input/output part.

Optical input/output parts 101 and an insulation film 102 are formed on the substrate 1 shown in FIG. 45(*a*). A resin 103 that is photocurable and thermoset and that is made of a material having a different refractive index depending on a curing condition, is coated on this substrate 1. Next, as shown in FIG. 45(*b*), a laser beam is irradiated onto an optical waveguide-formation scheduled area, thereby bringing about a curing reaction of the photocurable resin at the light-focusing part. Thus, photocured resin parts 104 are formed. Next, an uncured photocurable resin part 105 is baked to form a thermoset resin part 106 having a different refractive index (FIG. 45(c)). Each of the photocured resin parts 104 becomes a waveguide for an optical signal. It is also possible to form the thermoset resin part 106 by removing the uncured photocurable resin part 105 and forming and baking a different thermosetting resin on the whole surface of the substrate 1. In this case, the resin 103 needs to have only photocurable property.

According to the present embodiment, it is possible to form an optical waveguide with less transmission loss than an optical waveguide formed by a known photo lithography, for example. In other words, the photolithography is a method of exposure on the plane, and therefore, the cross section of the optical waveguide has a rectangular shape. On the other hand, when the photocurable resin is used as described in the present embodiment, it is possible to form the cross section of the optical waveguide having a circular shape, thereby reducing in the transmission loss. As a result, it is possible to improve the optical signal transmission performance. Further, as compared with the case of fixing a separately formed optical fiber on the substrate, there is no deviation of the optical axis. Therefore, the method of the present embodiment is suitable for forming a plurality of optical wave-guides having high wiring density.

Figure 45A:
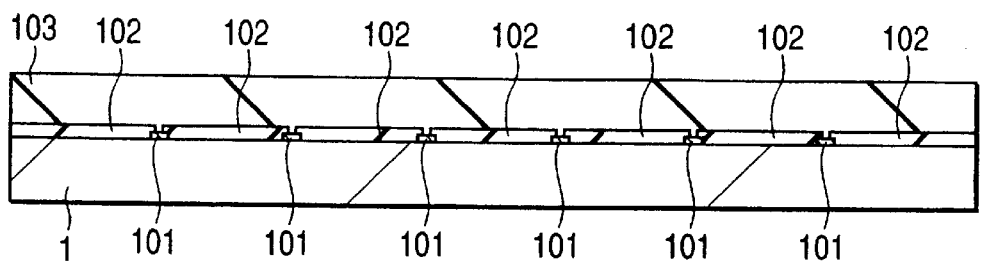
FIG. 45(a) is a cross-sectional view of a key part of a substrate showing a method of manufacturing a semiconductor integrated circuit device relating to embodiment 10 of the invention.
Figure 45B:
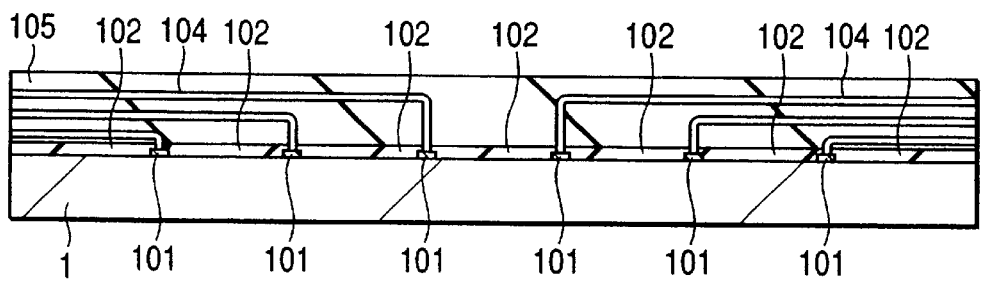
FIG. 45(b) is a cross-sectional view of a key part of a substrate showing a method of manufacturing a semiconductor integrated circuit device relating to embodiment 10 of the invention.
Figure 45C:
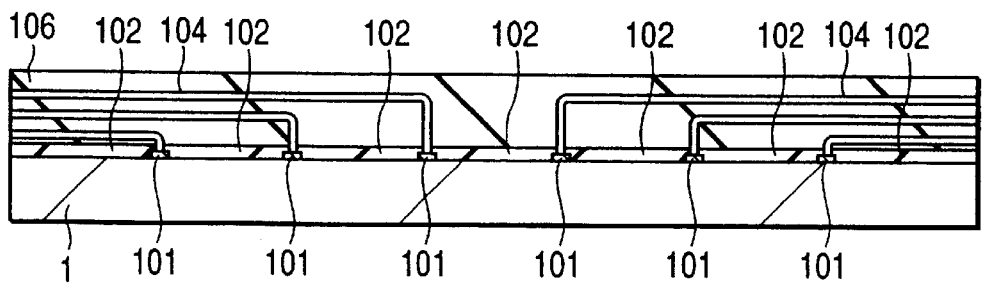
FIG. 45(c) is a cross-sectional view of a key part of a substrate showing a method of manufacturing a semiconductor integrated circuit device relating to embodiment 10 of the invention.
Figure 45D:
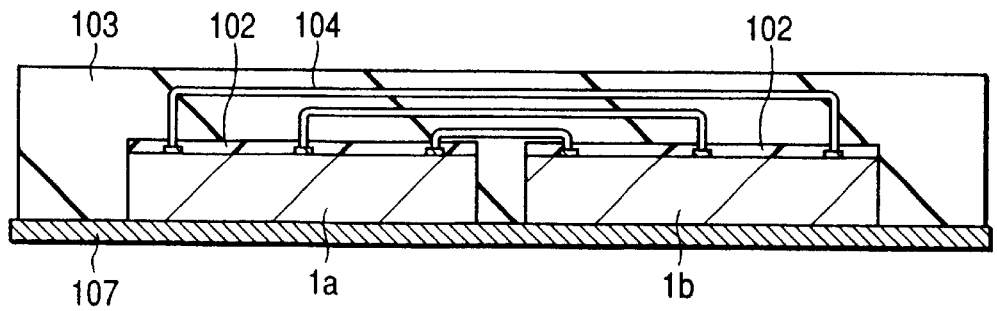
FIG. 45(d) is a cross-sectional view of a key part of a substrate showing a method of manufacturing a semiconductor integrated circuit device relating to embodiment 10 of the invention.

Further, when a plurality of chips 1a and 1b are mounted on a packaging substrate 107 as shown in FIG. 45(d), a resin 103 is coated on the packaging substrate 107 and the chips 1a and 1b. By radiating a laser beam onto the optical waveguide formation scheduled area, the chips 1a and 1b can be connected to each other by an optical waveguide consisting of photocured resin parts 104.

Figure 46A:
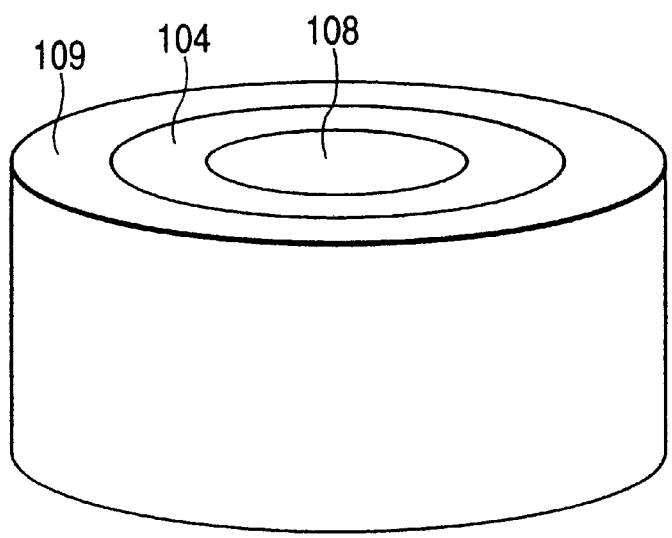
FIG. 46(a) is a diagram showing one example of a cross section of a cured resin part 104 shown in FIG. 45(b).

Further, each of photocured resin parts 104 is formed in a cylindrical shape, and a metal plating is provided on an inner part 108 thereof, and each outside of the photocured resin parts 104 is set as a ground layer 109, as shown in FIG. 46(a). When impedance is matched based on this structure, it is possible to form the inner part 108 of each of the photocured resin parts 104 as a high-frequency transmission path.

Figure 46B:
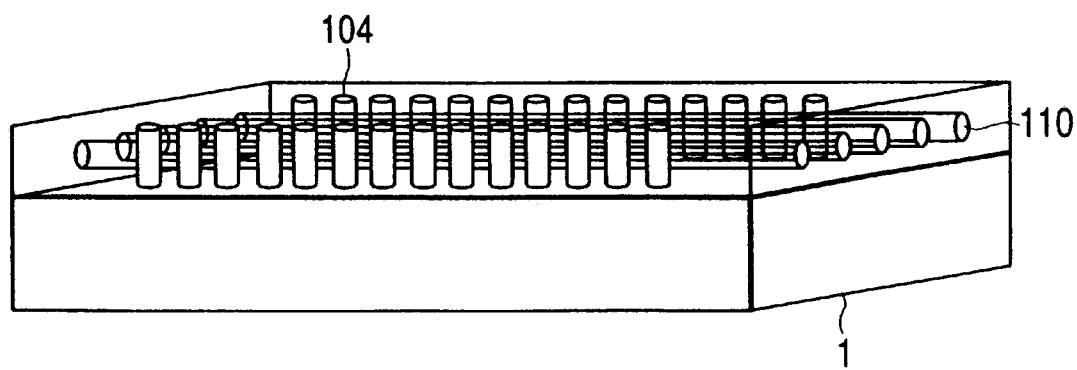
FIG. 46(b) is a perspective view of a substrate provided with a cooling pipe.

Further, as shown in FIG. 46(b), while each of the photocured resin parts 104 (only a portion near the optical input/output part is shown in the drawing) is formed, it is possible to simultaneously form pipes 110 for passing through a cooling agent by utilizing a photocurable resin. Each of these pipes can be used as a passage for passing through non-analyzed substance or the like to be inspected and analyzed by semiconductor integrated circuits in the chips, in addition to the cooling agent. Further, the optical wave-guides, the high-frequency transmission paths, the pipes for passing through a cooling agent, or the like, as shown in the present embodiment, can also be formed on the same substrate on which the guide layer shown in the Embodiments 1 to 8 is formed. As explained in the present invention, if the photocurable resin is used, it is possible to form the elements (such as the optical wave-guides, the high-frequency transmission paths, the guide layer for providing a cooling agent or metal wires, etc.) for various purposes on the same substrate.

As mentioned above, while the present invention made by inventors is explained in detail based on the embodiments, it is needless to say that the present invention is not limited to the above-mentioned embodiments and can be modified in various ways without departing from the scope and spirit of the invention.

Effects obtained from the representative invention disclosed can be briefly summarized as follows.

According to the present invention, a photocurable resin is utilized, and the resin near the metal wiring formation area that extends from the respective electrode parts before rearrangement to the respective bump electrodes contact area is cured by scanning with a laser beam, thereby forming guides for the metal wires. Thereafter, the respective metal wires are formed. Therefore, it is possible to form these metal wires and the guide layer that also works as a protection film for each of the metal wires in a relatively simple process and with high precision. Further, according to the present invention, it is possible to form easily the metal wires 7 having an approximately S shape (or an approximately inverse Z shape) It is also possible to relax the stress applied to the bump electrode.

What is claimed is:

1. A semiconductor integrated circuit device, the device comprising:
   (a) a packaging substrate mounted with a chip having a semiconductor integrated circuit;
   (b) a plurality of optical waveguides for a signal being input/output to/from said chip, the plurality of optical waveguides being comprised of a cured resin part formed by curing a photocurable resin using a laser beam; and
   (c) a resin embedded between said plurality of optical waveguides and having a refractive index different from that of each of said optical wave covering a surface of said chip.

2. The semiconductor integrated circuit device according to claim 1, further comprising:
   (d) a passage pipe formed near the chip and formed in a cylindrical shape by curing a photocurable resin.

3. The semiconductor integrated circuit device according to claim 1, wherein each section of said plurality of optical waveguides has a substantially circle shape.

4. The semiconductor integrated circuit device according to claim 1, wherein said plurality of optical waveguides extend in a vertical direction from a input/output portion of the signal being input/output from/to said chip and further extend in a horizontal direction through a bending portion.

* * * * *